(12) United States Patent
Yun

(10) Patent No.: US 9,721,965 B2
(45) Date of Patent: Aug. 1, 2017

(54) NON-VOLATILE MEMORY DEVICE HAVING VERTICAL CELL

(71) Applicant: SAMSUNG ELECTRONICS CO., LTD., Suwon-si, Gyeonggi-Do (KR)

(72) Inventor: Jang-Gn Yun, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 63 days.

(21) Appl. No.: 14/564,165

(22) Filed: Dec. 9, 2014

(65) Prior Publication Data
US 2015/0364487 A1    Dec. 17, 2015

(30) Foreign Application Priority Data

Jun. 11, 2014    (KR) .................. 10-2014-0071041

(51) Int. Cl.
*H01L 27/115*    (2017.01)
*H01L 27/11582*    (2017.01)
*H01L 27/1157*    (2017.01)

(52) U.S. Cl.
CPC .... *H01L 27/11582* (2013.01); *H01L 27/1157* (2013.01)

(58) Field of Classification Search
CPC .......... H01L 27/1127; H01L 27/11507; H01L 27/11514; H01L 27/11578; H01L 29/7926; H01L 27/11551; H01L 29/42344; H01L 29/7827
See application file for complete search history.

(56) References Cited

U.S. PATENT DOCUMENTS

| 8,194,467 B2 | 6/2012 | Mikajiri et al. |
| 2012/0273865 A1* | 11/2012 | Lee .................. H01L 27/11582 257/316 |
| 2013/0009235 A1* | 1/2013 | Yoo .................... H01L 29/7926 257/329 |
| 2013/0286747 A1 | 10/2013 | Kwak |

OTHER PUBLICATIONS

Ryota Katsumata et al., "Pipe-shaped BiCS Flash Memory with 16 Stacked Layers and Multi-Level-Cell Operation for Ultra High Density Storage Devices", 2009 Symposium on VLSI Technology Digest of Technical Papers, Jun. 16-18, 2009, pp. 136-137.

* cited by examiner

*Primary Examiner* — Davienne Monbleau
*Assistant Examiner* — Leslie Pilar Cruz
(74) *Attorney, Agent, or Firm* — F. Chau & Associates, LLC

(57) ABSTRACT

Provided is a non-volatile memory device having a vertical channel cell. The non-volatile memory device includes a substrate having a well. A first vertical channel and a second vertical channel are in contact with the well, and protrude from the well. A pipe channel connecting the first and second vertical channels is disposed. A cut-off gate electrode stacked over the well, and surrounding side surfaces of the first and second vertical channels is disposed. A pipe gate electrode stacked over the cut-off gate electrode, and having the pipe channel is disposed. A plurality of memory-cell gate electrodes stacked over the pipe gate electrode, and surrounding the side surfaces of the first and second vertical channels is disposed. A select gate electrode stacked over the plurality of memory-cell gate electrodes, and surrounding the side surfaces of the first and second vertical channels is disposed.

15 Claims, 54 Drawing Sheets

# NON-VOLATILE MEMORY DEVICE HAVING VERTICAL CELL

CROSS-REFERENCE TO RELATED APPLICATION

This application claims priority under 35 U.S.C. §119 to Korean Patent Application No. 10-2014-0071041 filed on Jun. 11, 2014 in the Korean Intellectual Property Office, the disclosure of which is incorporated by reference herein in its entirety.

TECHNICAL FIELD

The inventive concept relates to a non-volatile memory device having a vertical cell.

DISCUSSION OF RELATED ART

The semiconductor memory devices are classified into volatile memory devices and non-volatile memory devices. The non-volatile memory devices can store data even when a power source thereof turns off. The non-volatile memory device can be divided into a memory cell area in which a memory cell array is formed on a silicon substrate, and a peripheral area in which peripheral circuits other than the memory cell are disposed. Various methods of vertically forming a plurality of memory cells on the substrate are being studied to increase the degree of integration thereof in a limited area of the memory cell area, and improve performance.

SUMMARY

In accordance with an exemplary embodiment of the inventive concept, a non-volatile memory device is provided. The non-volatile memory device includes a substrate having a well. A first vertical channel and a second vertical channel each contacting the well, and protruding from the well are disposed. A pipe channel configured to connect the first and second vertical channels is disposed. A cut-off gate electrode stacked over the well, and surrounding sides of the first and second vertical channels that vertically pass through is disposed. A pipe gate electrode stacked over the cut-off gate electrode, and having the pipe channel is disposed. A plurality of memory-cell gate electrodes stacked over the pipe gate electrode, and surrounding the sides of the first and second vertical channels that vertically pass through are disposed. A select gate electrode stacked over the plurality of memory-cell gate electrodes, and surrounding the sides of the first and second vertical channels that vertically pass through is disposed. A plurality of interlayer insulating layers are formed between all of the well, the cut-off gate electrode, the pipe gate electrode, the plurality of memory-cell gate electrodes, and the select gate electrode.

In accordance with an exemplary embodiment of the inventive concept, a non-volatile memory device is provided. The non-volatile memory device includes a substrate having a well. A layered structure including a plurality of interlayer insulating layers separately stacked over the well, and a cut-off gate electrode, a pipe gate electrode, a plurality of memory-cell gate electrodes and a select gate electrode, which are sequentially formed between the plurality of interlayer insulating layers over the well, is formed. A channel structure including first and second vertical channels vertically passing through the layered structure and contacting the well, and a pipe channel connecting the first and second vertical channels is formed. A channel isolation pattern vertically disconnecting the select gate electrode and the plurality of memory-cell gate electrodes located between the first and second vertical channels is disposed. The first and second vertical channels are formed in first and second channel holes vertically passing through the layered structure and expose the well. The pipe channel is formed in a pipe connection space horizontally connected to sides of the first and second channel holes in the pipe gate electrode.

In accordance with an exemplary embodiment of the inventive concept, a non-volatile memory device is provided. The non-volatile memory device includes a substrate having a well. A pipe gate electrode stacked over the well is disposed. A first vertical channel and a second vertical channel protruding from the pipe gate electrode are disposed. A plurality of memory-cell gate electrodes repeatedly stacked over the pipe gate electrode, and surrounding sides of the first and second vertical channels that vertically pass through are disposed. A select gate electrode stacked over the plurality of memory-cell gate electrodes, and surrounding the sides of the first and second vertical channels that vertically pass through is disposed. A pipe channel formed in the pipe gate electrode, and connected to bottoms of the first and second vertical channels is disposed. The pipe channel connects the first and second vertical channels, wherein the pipe channel have a pipe channel extending part of which one side horizontally extends. A plurality of interlayer insulating layers are formed between all of the pipe gate electrode, the plurality of memory-cell gate electrodes, and the select gate electrode. A substrate extending part configured to contact the well, protrude from the well, and of which a part of a side contacts the pipe channel extending part, is formed.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1A:
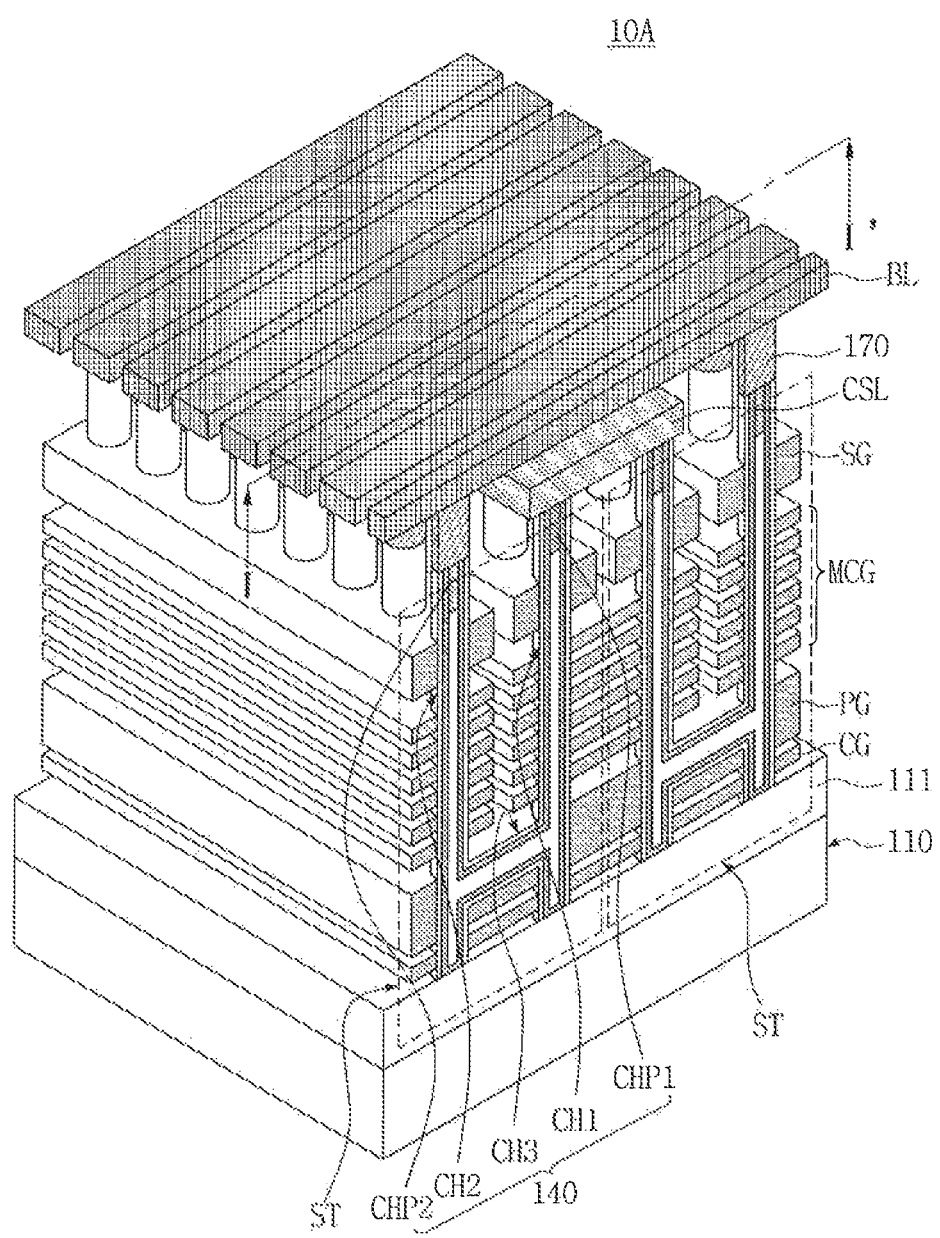
FIG. 1A is a schematic perspective view of a non-volatile memory device in accordance with an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 1B:
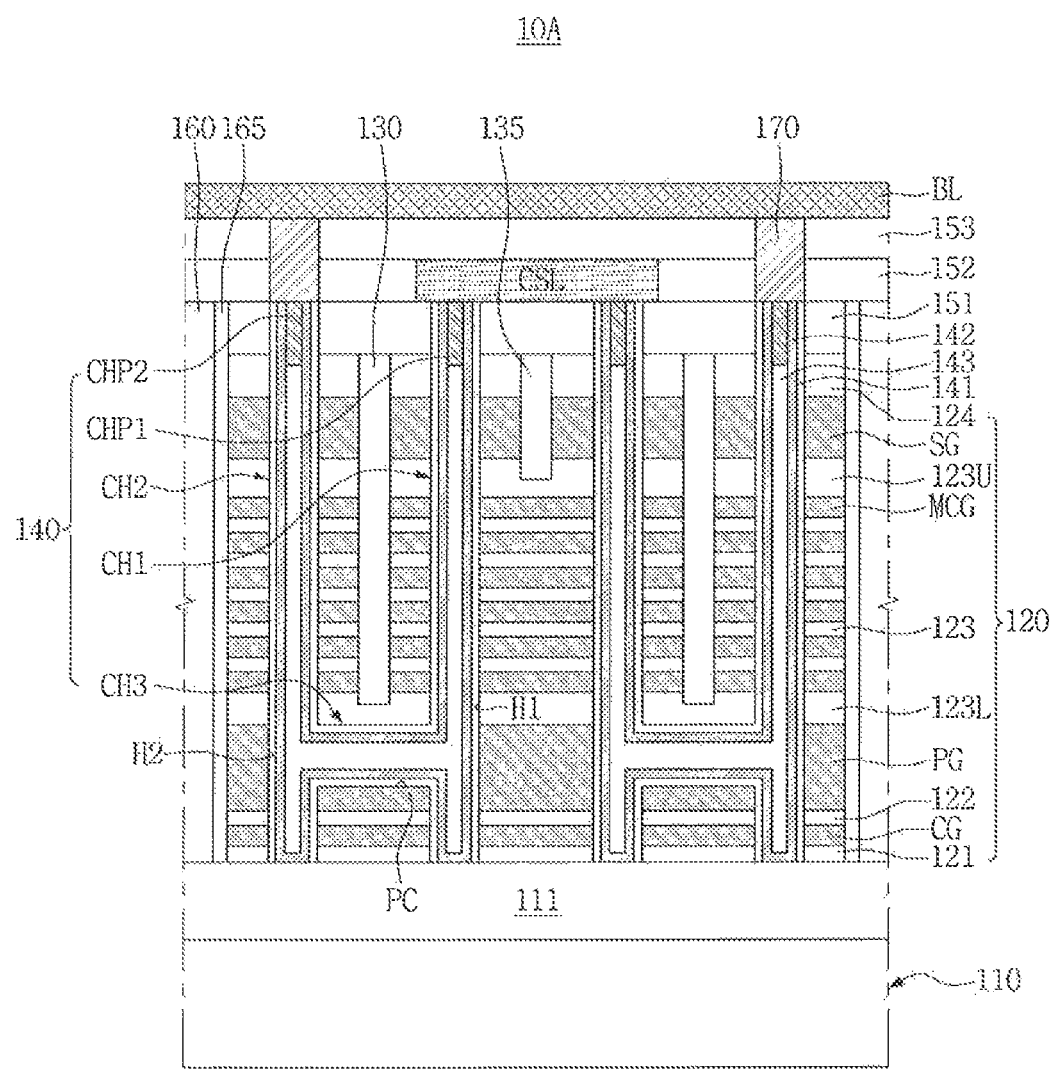
FIG. 1B is a vertical cross-sectional view taken along line I-I' shown in FIG. 1A.
Figure 1C:
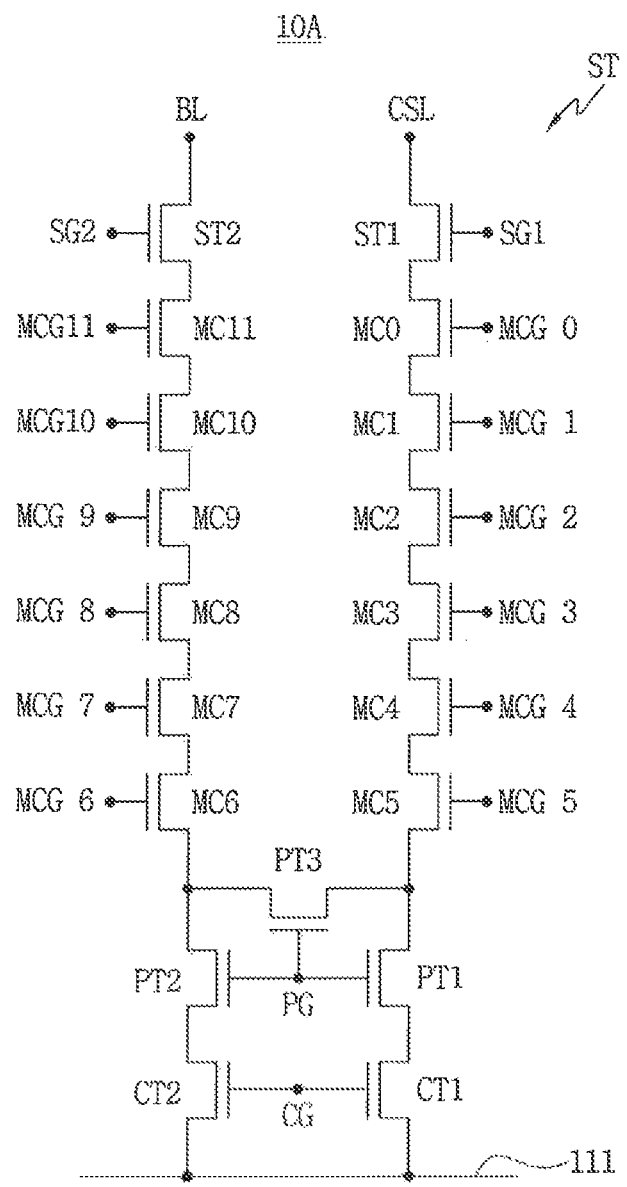
FIG. 1C is an equivalent circuit diagram showing a string ST shown in FIG. 1A.

FIG. 1A is a schematic perspective view of a non-volatile memory device in accordance with an exemplary embodiment of the inventive concept, FIG. 1B is a vertical cross-sectional view taken along line I-I' shown in FIG. 1A, and FIG. 1C is an equivalent circuit diagram showing a string ST shown in FIG. 1A.

Referring to FIGS. 1A and 1B, a non-volatile memory device 10A in accordance with an exemplary embodiment of the inventive concept may include a substrate 110 having a well 111, a layered structure 120 having a cut-off gate electrode CG, channel isolation patterns 130, and channel structures 140. Further, the non-volatile memory device 10A may include select line isolation patterns 135, first to third capping layers 151, 152, and 153, device isolation patterns 160, spacer 165, common source lines CSL, bit plugs 170, and bit lines BL.

The substrate 110 may include a single-crystalline silicon wafer, a silicon on insulator (SOI) wafer, a silicon-germanium wafer, etc. The well 111 may include an N-well or a P-well.

The layered structure 120 may include a plurality of interlayer insulating layers 121, 122, 123L, 123, 123U, and 124 stacked over the well 111. The layered structure 120 may include a cut-off gate electrode CG, a pipe gate electrode PG, a plurality of memory-cell gate electrodes MCG, and a select gate electrode SG, which are sequentially formed between the plurality of interlayer insulating layers 121, 122, 123L, 123, 123U, and 124 over the well 111.

The select gate electrode SG and the pipe gate electrode PG may be relatively thick compared with the cut-off gate electrode CG and the plurality of memory-cell gate electrodes MCG. The plurality of memory-cell gate electrodes MCG includes six layers. However, the present inventive concept is not limited thereto, and the number of layers of the memory-cell gate electrodes MCG may be greater or smaller.

The gate electrodes CG, PG, MCG, and SG may include polysilicon, a metal, a metal compound, or a metal alloy. The metal, for example, may include tungsten (W). When the gate electrodes CG, PG, MCG, and SG have metals, a barrier metal layer may be further formed between the gate electrodes CC, PG, MCG, and SG and the interlayer insulating layers 121, 122, 123L, 123, 123U, and 124, and between the gate electrodes CG, PG, MCG, and SG and the channel structure 140 which will be described later. The barrier metal layer may include titanium nitride (TiN).

The plurality of interlayer insulating layers 121, 122, 123L, 123, 123U, and 124, for example, may include a lowermost interlayer insulating layer 121 formed between the well 111 and the cut-off gate electrode CG, and a lower interlayer insulating layer 122 formed between the cut-off gate electrode CG and the pipe gate electrode PG. The plurality of interlayer insulating layers 121, 122, 123L, 123, 123U, and 124 may include intermediate interlayer insulating layers 123L, 123, and 123U formed between and/or over and under the memory-cell gate electrodes MCG. The intermediate interlayer insulating layers 123L, 123 and 123U may include a lowermost intermediate interlayer insulating layer 123L formed between the pipe gate electrode PG and the lowermost memory-cell gate electrode MCG, and an uppermost intermediate interlayer insulating layer 123U formed between the select gate electrode SG and the uppermost memory-cell gate electrode MCG. The plurality of interlayer insulating layers 121, 122, 123L, 123, 123U, and 124 may include an upper interlayer insulating layer 124 formed on the select gate electrode SG. The lowermost intermediate interlayer insulating layer 123L, the uppermost intermediate interlayer insulating layer 123U, and the upper interlayer insulating layer 124 may be relatively thicker than the other interlayer insulating layers 121, 122, and 123.

The plurality of interlayer insulating layers 121, 122, 123L, 123, 123U, and 124 may insulate the gate electrodes CG, PG, MCG, and SG. The plurality of interlayer insulating layers 121, 122, 123L, 123, 123U, and 124, for example, may include silicon oxide.

Each of the channel structures 140 may include first and second vertical channels CH1 and CH2, a pipe channel CH3, and channel pads CHP1 and CHP2. Each of the channel structures 140 may have a single string ST.

The first and second vertical channels CH1 and CH2 each may vertically pass through the layered structure 120, and contact with the well 111. For example, the first and second vertical channels CH1 and CH2 each may protrude from the well 111. The first and second vertical channels CH1 and CH2 each may be formed in first and second channel holes H1 and H2 exposing the well 111. The first and second channel holes H1 and H2 may vertically pass through the layered structure 120. The first and second channel holes H1 and H2 may be horizontally spaced apart from each other.

The pipe channel CH3 may connect the first vertical channel CH1 and the second vertical channel CH2. The pipe channel CH3 may be formed in a pipe connection space PG horizontally connected to some parts of sides of the first and second channel holes H1 and H2 in the pipe gate electrode PG. A width of the pipe connection space PG may correspond to a distance between the first and second channel holes H1 and H2. The pipe gate electrode PG may surround sides of the first and second vertical channels CH1 and CH2 that vertically pass through and a side of the pipe channel CH3, to connect the side of the pipe channel CH3.

The channel structure 140 may include a gate insulating pattern 141 conformally formed on inside walls of the first and second channel holes H1 and H2 and the pipe connection space PG. The gate insulating pattern 141 need not be formed on the well 111 exposed by the first and second channel holes H1 and H2.

The channel structure 140 may include a channel active pattern 142 conformally formed on the gate insulating pattern 141 and the well 111 exposed by the first and second channel holes H1 and H2.

The channel structure 140 may include a channel core pattern 143 configured to fill the first and second channel holes H1 and H2 and the pipe connection space PG on the channel active pattern 142.

The gate insulating pattern 141 is shown as a single layer in the drawing. Alternatively, the gate insulating pattern 141 may be formed as a multilayer. For example, the gate insulating pattern 141 may include a charge barrier layer, a charge trap layer, and a tunnel insulating layer, which are sequentially formed in a direction of the channel active pattern 142 from the inside walls of the first and second channel holes H1 and H2 and the pipe connection space PG. The charge barrier layer, for example, may include silicon oxide. The charge trap layer, for example, may include silicon nitride or a high-k dielectric material. The high-k dielectric material may include any one of aluminum oxide (AlO), zirconium oxide (ZrO), hafnium oxide (HfO), and lanthanum oxide (LaO). The tunnel insulating layer, for example, may include silicon oxide.

The channel active pattern 142 may include polysilicon.

The channel core pattern 143 may include an insulating material. For example, the channel core pattern 143 may include silicon oxide.

The gate insulating pattern 141 in the first and second vertical channels CH1 and CH2, and the gate insulating pattern 141 in the pipe channel CH3 may be physically contiguous. The channel active pattern 142 in the first and second vertical channels CH1 and CH2, and the channel active pattern 142 in the pipe channel CH3 may be physically contiguous. The channel core pattern 143 in the first and second vertical channels CH1 and CH2, and the channel core pattern 143 in the pipe channel CH3 may be physically contiguous.

The channel pads CHP1 and CHP2 may be formed in channel pad spaces Spa1 and Spa2 (see FIG. 5N) partially recessed from an upper portion of the channel core pattern 143 of the first and second vertical channels CH1 and CH2, respectively. For example, the source-side channel pad CHP1 may be formed in a first channel pad space Spa1 of an upper portion of the channel core pattern 143 in the first vertical channel CH1. The drain-side channel pad CHP2 may be formed in a second channel pad space Spa2 of an upper portion of the channel core pattern 143 in the second vertical channel CH2.

Sides of the source-side and drain-side channel pads CHP1 and CHP2 may be surrounded by the corresponding channel active pattern 142. The source-side and drain-side channel pads CHP1 and CHP2, for example, may include polysilicon doped with a high concentration N-type impurity.

The channel isolation patterns 130 may vertically cut the select gate electrode SG and the plurality of memory-cell gate electrodes MCG between the first and second vertical channels CH1 and CH2.

The channel isolation patterns 130 may be formed by filling a channel isolation trench Tc (see FIG. 5E) vertically passing through the select gate electrode SG, the plurality of memory-cell gate electrodes MCG, and the plurality of interlayer insulating layers 123U, 123, and 124 formed between and/or over and under the gate electrodes SG and MCG with an insulating material.

A bottom of the channel isolation pattern 130 may be in the lowermost intermediate interlayer insulating layer 123L.

The channel isolation pattern 130 may include the same material as the upper interlayer insulating layer 124, and the plurality of intermediate interlayer insulating layers 123U, 123, and 123L. For example, the channel isolation pattern 130 may include silicon oxide.

The select gate electrode SG may be divided into a first select gate electrode SG1 surrounding the side of the first vertical channel CH1, and a second select gate electrode SG2 surrounding the side of the second vertical channel CH2 by the channel isolation pattern 130 (see FIG. 1C). Further, the memory-cell gate electrodes MCG may be divided into a first group of the memory-cell gate electrodes MCG0 to MCG5 surrounding the side of the first vertical channel CH1, and a second group of the memory-cell gate electrodes MCG6 to MCG11 surrounding the side of the second vertical channel CH2 (see FIG. 1C).

The select line isolation pattern 135 may include an insulating material vertically passing through the select gate electrode SG located between adjacent channel structures 140. The strings ST may be separated by the select line isolation pattern 135.

The select line isolation pattern 135 may be formed by filling a select line isolation trench T1 (see FIG. 5F) vertically passing through the upper interlayer insulating layer 124, the select gate electrode SG, and the uppermost intermediate interlayer insulating layer 123U with an insulating material. A bottom of the select line isolation pattern 135 may be formed in the uppermost intermediate interlayer insulating layer 123U. The select line isolation pattern 135 may include the same material as the upper interlayer insulating layer 124 and the uppermost intermediate interlayer insulating layer 123U. For example, the select line isolation pattern 135 may include silicon oxide.

The first capping layer 151 may be formed on the upper interlayer insulating layer 124. The first capping layer 151 may surround the sides of the first and second vertical channels CH1 and CH2. The second capping layer 152 may be formed on the first capping layer 151. The third capping layer 153 may be formed on the second capping layer 152. The first to third capping layers 151 to 153 may include silicon oxide.

The common source line CSL may be electrically connected to the source-side channel pad CHP1 of the first vertical channel CH1 in the channel structure 140. The common source line CSL may be a common source line configured to commonly connect to a first vertical channel CH1 of an adjacent channel structure 140. The common source line CSL may vertically pass through the second capping layer 152, and may be formed on the first vertical channel CH1 of the adjacent channel structure 140. Sides of the common source line CSL may be surrounded by the second capping layer 152. The common source line CSL may include a metal or a metal compound. The metal, for example, may include tungsten (W) or aluminum (Al). For example, multiple common source lines CSL may be formed. The common source lines CSL may have line shapes in parallel in a top view.

The device isolation patterns 160 may vertically pass through the first capping layer 151 and the layered structure 120, and contact the well 111. The device isolation patterns 160 may be spaced apart from each other in a horizontal direction in a top view. The device isolation patterns 160 may include silicon oxide. The spacers 165 may be disposed on sides of the device isolation patterns 160. The spacers 165 may be formed between the device isolation patterns 160 and the layered structures 120.

The bit plug 170 may be electrically connected to the drain-side channel pad CHP2 of the second vertical channel CH2. The bit plug 170 may vertically pass through the second and third capping layers 152 and 153, and may be formed on the second vertical channel CH2. Sides of the bit plug 170 may be surrounded by the second and third capping layers 152 and 153. The bit plug 170 may include a metal, a metal compound, or a metal silicide. The metal, for example, may include tungsten (W).

The bit lines BL may be electrically connected to the bit plugs 170. The bit lines BL may be formed on the third capping layer 153. The bit lines BL may have line shapes in parallel in a top view. Further, the bit lines BL may be formed to cross the common source lines CSL in a top view.

Further referring to FIG. 1C, the first vertical channel CH1 may have an equivalent circuit in which a first select transistor ST1, a first group of memory cells MC0 to MC5, a first pipe transistor PT1, and a first cut-off transistor CT1, which are generated as the first vertical channel CH1, passes through the first select gate electrode SG1, the first group of the memory-cell gate electrodes MCG0 to MCG5, the pipe gate electrode PG, and the cut-off gate electrode CG, are connected in series between the common source line CSL and the well 111.

The second vertical channel CH2 may have an equivalent circuit in which a second select transistor ST2, a second group of memory cells MC6 to MC11, a second pipe transistor PT2, and a second cut-off transistor CT2, which are generated as the second vertical channel CH2 passes through the second select gate electrode SG1, the second group of the memory-cell gate electrodes MCG6 to MCG11, the pipe gate electrode PG, and the cut-off gate electrode CG, are connected in series between the bit line BL and the well 111.

The pipe channel CH3 may have an equivalent circuit in which a third pipe transistor PT3, which is generated as the pipe channel CH3 is buried in the pipe gate electrode PG between the first vertical channel CH1 and the second vertical channel CH2, is connected in series to the first group and second group of memory cells MC0 to MC5 and MC6 to MC11.

The pipe gate electrode PG is a common gate electrode of the first to third pipe transistors PT1 to PT3, and the cut-off gate electrode CG is a common gate electrode of the first and second cut-off transistors CT1 and CT2.

The non-volatile memory device 10A applies an on-voltage to the pipe gate electrode PG and an off-voltage to the cut-off gate electrode CG when program and read operations are performed. Then, the first to third pipe transistors PT1 to PT3 are turned on, and the first and second cut-off transistors CT1 and CT2 are turned off. Thus, the first and second vertical channels CH1 and CH2 are connected to the pipe channel CH3, and not connected to the well 111. For example, the channel structure 140 may have a string of a U-shaped array, but may be electrically disconnected to the well 111. Thus, leakage current that may flow into the well 111 may be prevented when program and read operations are performed. Because of this, boosting voltages of unselected memory cells may also be maintained when the program is performed.

The non-volatile memory device 10A applies an on-voltage to the pipe gate electrode PG and an on-voltage to the cut-off gate electrode CG when an erase operation is performed. Then, the first to third pipe transistors PT1 to PT3 are turned on, and the first and second cut-off transistors CT1 and CT2 are also turned on. Thus, the first and second vertical channels CH1 and CH2 are connected to the pipe channel CH3, and also connected to the well 111. For example, the channel structure 140 may have a string of an H-shaped array, and may be electrically connected to the well 111. Since the first and second vertical channels CH1 and CH2 of the channel structure 140 are electrically connected to the well 111, each of the first and second vertical channels CH1 and CH2 may operate as a channel structure having a string of a line shape array when the erase operation is performed.

Thus, when the erase operation is performed, a low erase voltage is applied to the first group and second group of memory cells MCG0 to MCG5 and MCG6 to MCG11, and a high erase voltage is applied to the well 111, and then the first group and second group of memory cells MC0 to MC5 and MC6 to MC11 may be erased at once by a potential difference between the first group and second group of memory-cell gate electrodes MCG0 to MCG5 and MCG6 to MCG11, and the well 111. Thus, the erase operation may be easier, and an erasing time may also be reduced.

Figure 2A:
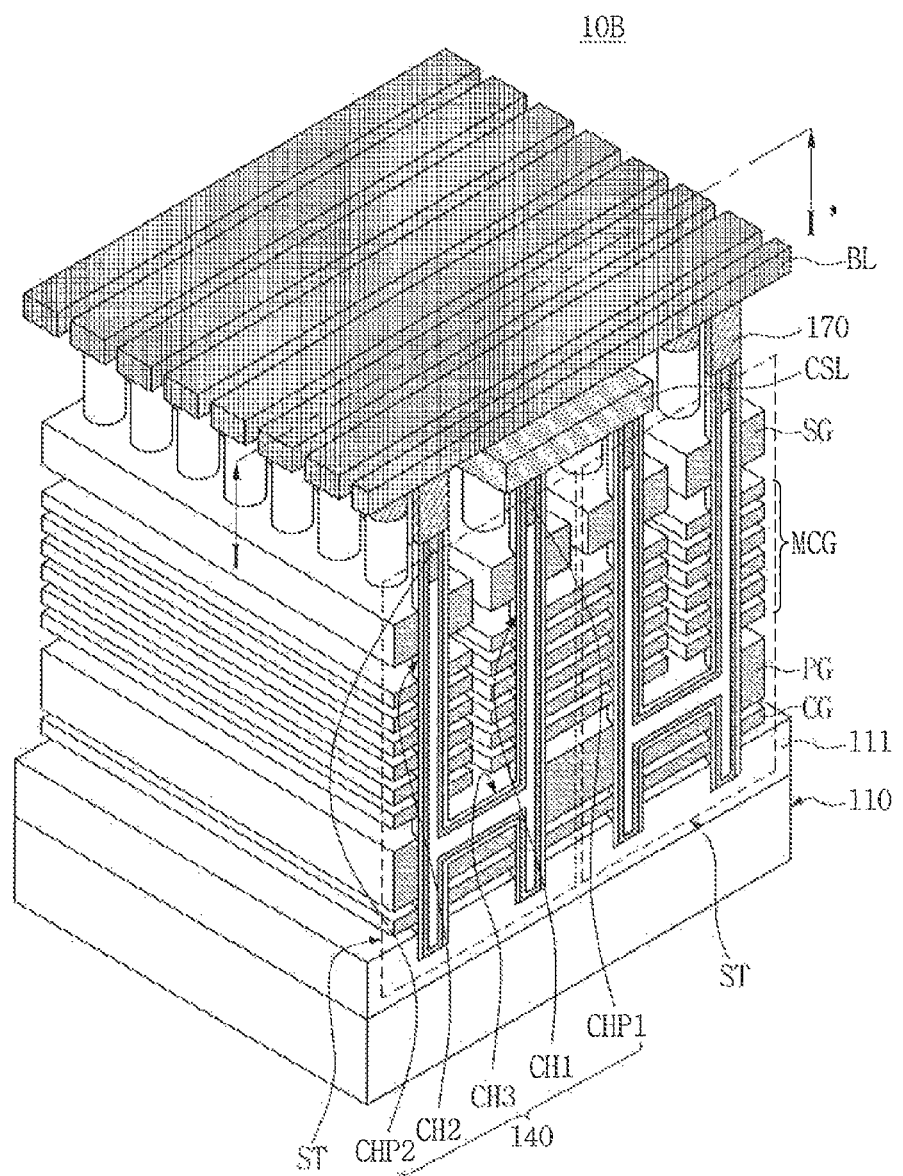
FIG. 2A is a perspective view of a non-volatile memory device in accordance with an exemplary embodiment of the inventive concept.
Figure 2B:
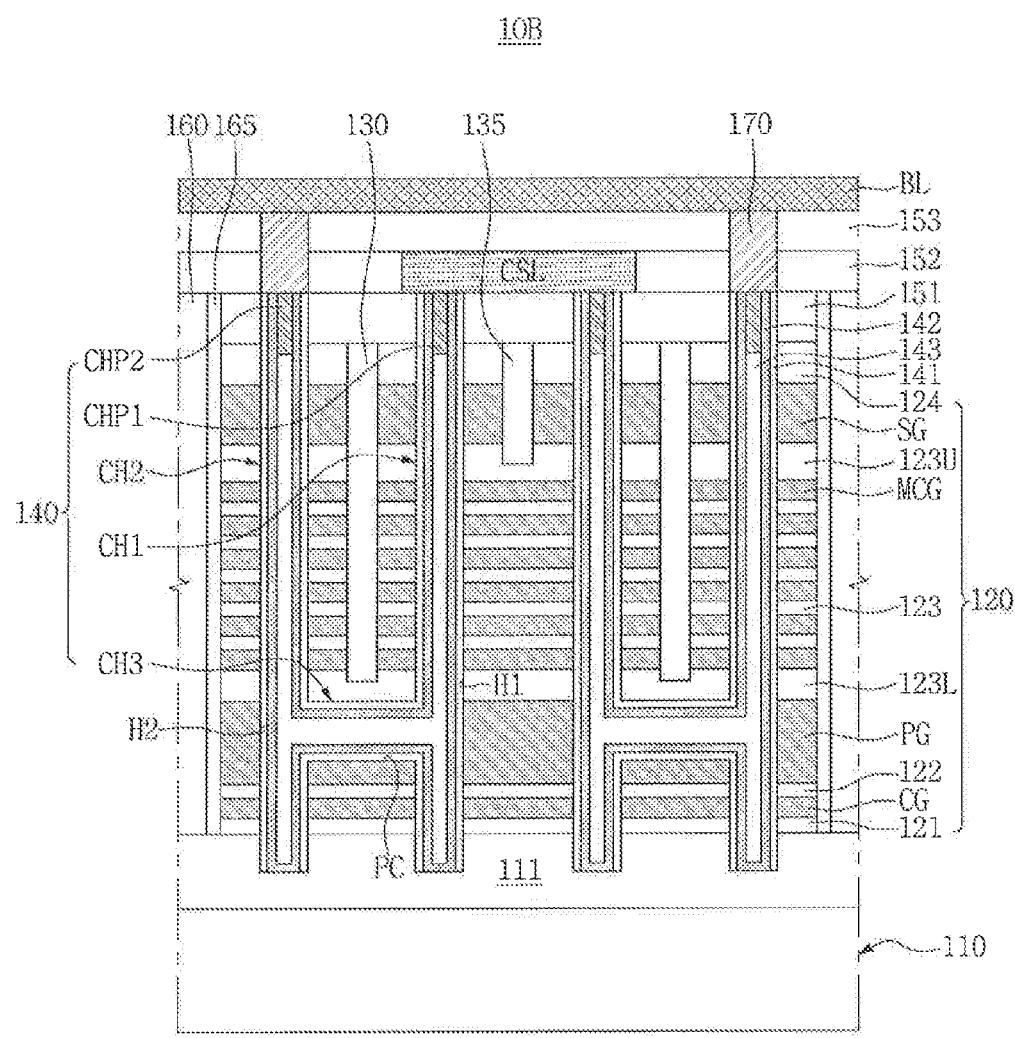
FIG. 2B is a vertical cross-sectional view taken along line I-I' shown in FIG. 2A.

FIG. 2A is a perspective view of a nonvolatile memory device in accordance with an exemplary embodiment of the inventive concept, and FIG. 2B is a vertical cross-sectional view taken along line I-I' shown in FIG. 2A. Since a non-volatile memory device 10B is the same as the non-volatile memory device 10A shown in FIGS. 1A and 1B except that the first and second vertical channels CH1 and CH2 protrude into the well 111, detailed descriptions of the same components may be omitted.

Referring to FIGS. 2A and 2B, lower ends of the first and second vertical channels CH1 and CH2 may protrude into the well 111. Bottoms of the first and second vertical channels CH1 and CH2 may be formed in the well 111.

Operations of the non-volatile memory device 10B in accordance with an exemplary embodiment are the same as described in FIG. 1C.

Figure 3A:
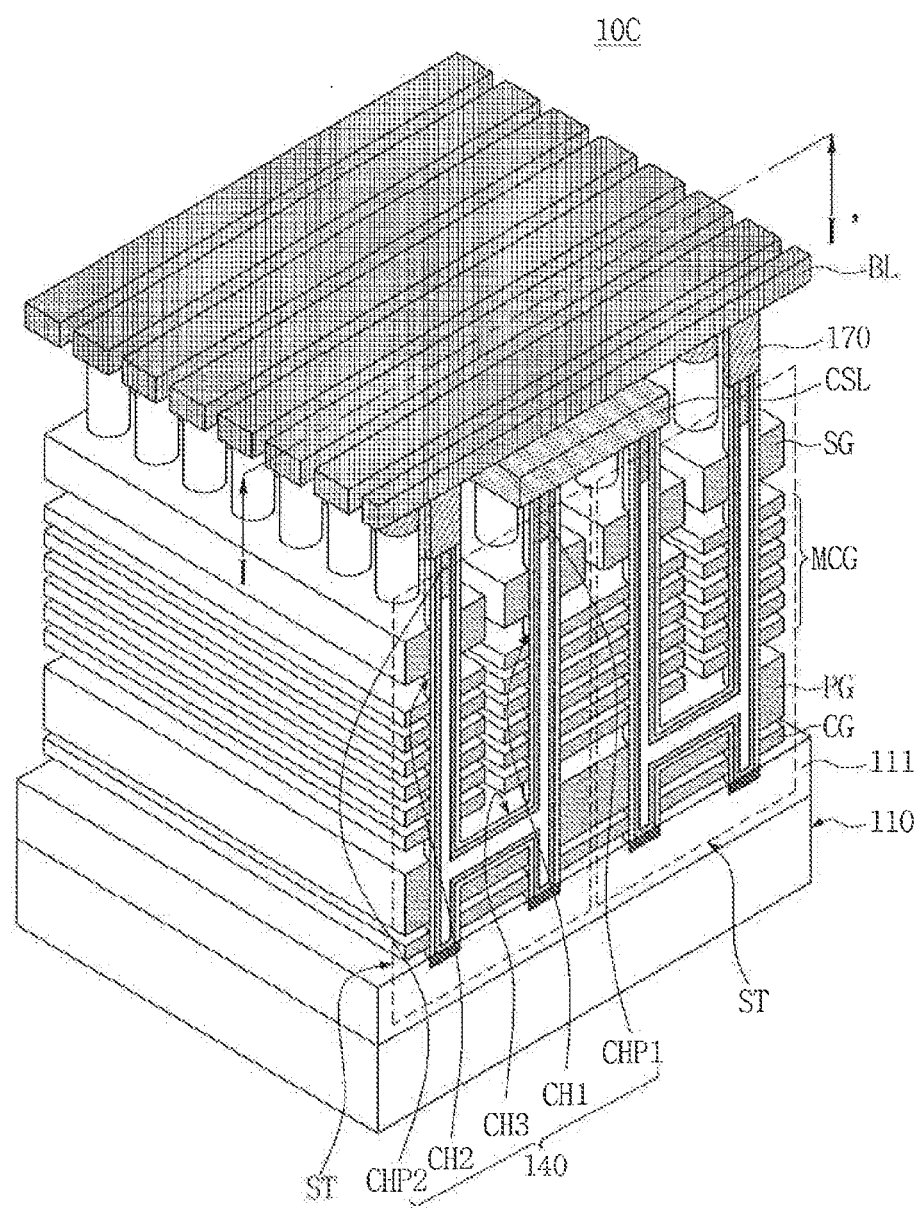
FIG. 3A is a perspective view of a non-volatile memory device in accordance with an exemplary embodiment of the inventive concept.
Figure 3B:
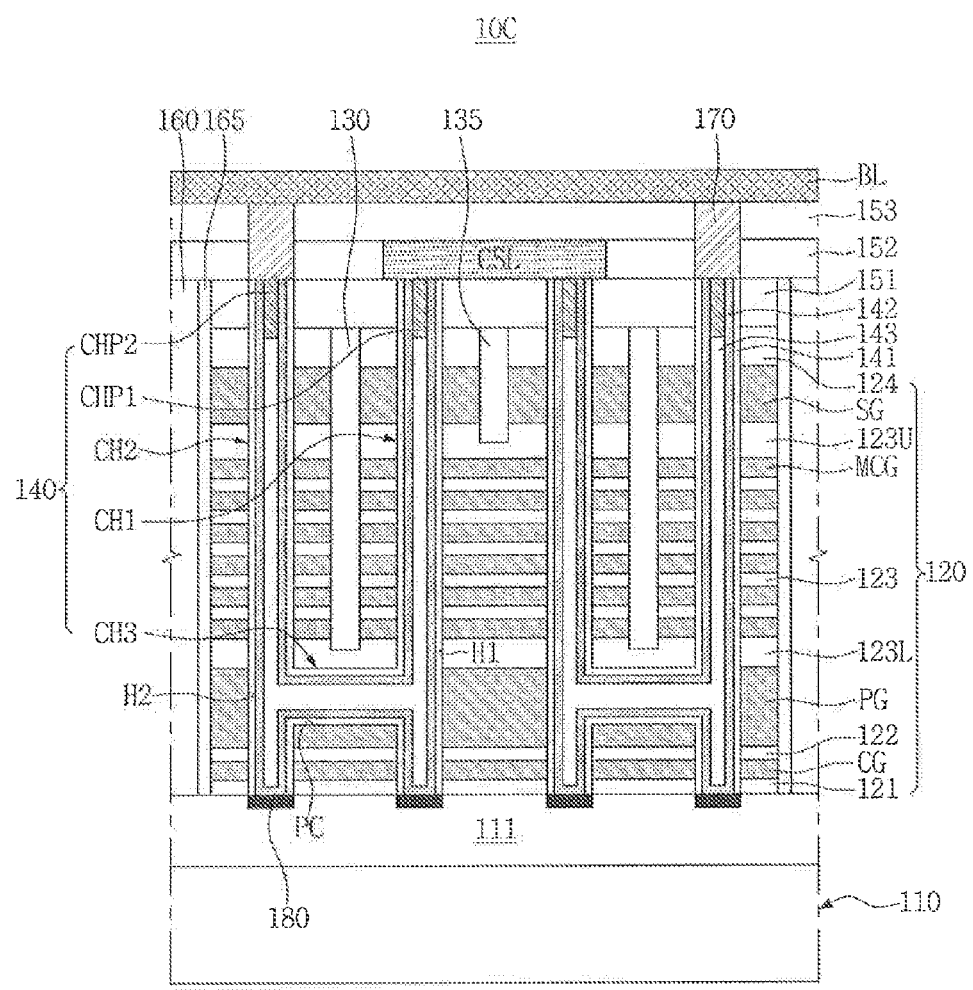
FIG. 3B is a vertical cross-sectional view taken along line I-I' shown in FIG. 3A.

FIG. 3A is a perspective view of a non-volatile memory device in accordance with an exemplary embodiment of the inventive concept, and FIG. 3B is a vertical cross-sectional view taken along line I-I' shown in FIG. 3A. Since a non-volatile memory device 10C in accordance with an exemplary embodiment is the same as the non-volatile memory device 10A shown in FIGS. 1A and 1B except for including a selective epitaxial growth layer 180, detailed descriptions of the same components may be omitted.

Referring to FIGS. 3A and 3B, the non-volatile memory device 10C may include the selective epitaxial growth layer 180 formed between the bottoms of the first and second vertical channels CH1 and CH2, and the well 111.

The first and second vertical channels CH1 and CH2, and the well 111 may be electrically connected through the selective epitaxial growth layer 180. As the selective epitaxial growth layer 180 contacts the channel active pattern 142 of the channel structure 140, and a path, in which current flows, is maximized, resistance may be reduced.

The selective epitaxial growth layer 180 may be formed in the well 111. An upper surface of the selective epitaxial growth layer 180 may be coplanar with an upper surface of the well 111. The upper surface of the selective epitaxial growth layer 180 may protrude more than the upper surface of the well 111.

Operations of the non-volatile memory device 10C in accordance with an exemplary embodiment are the same as described in FIG. 1C.

Figure 4A:
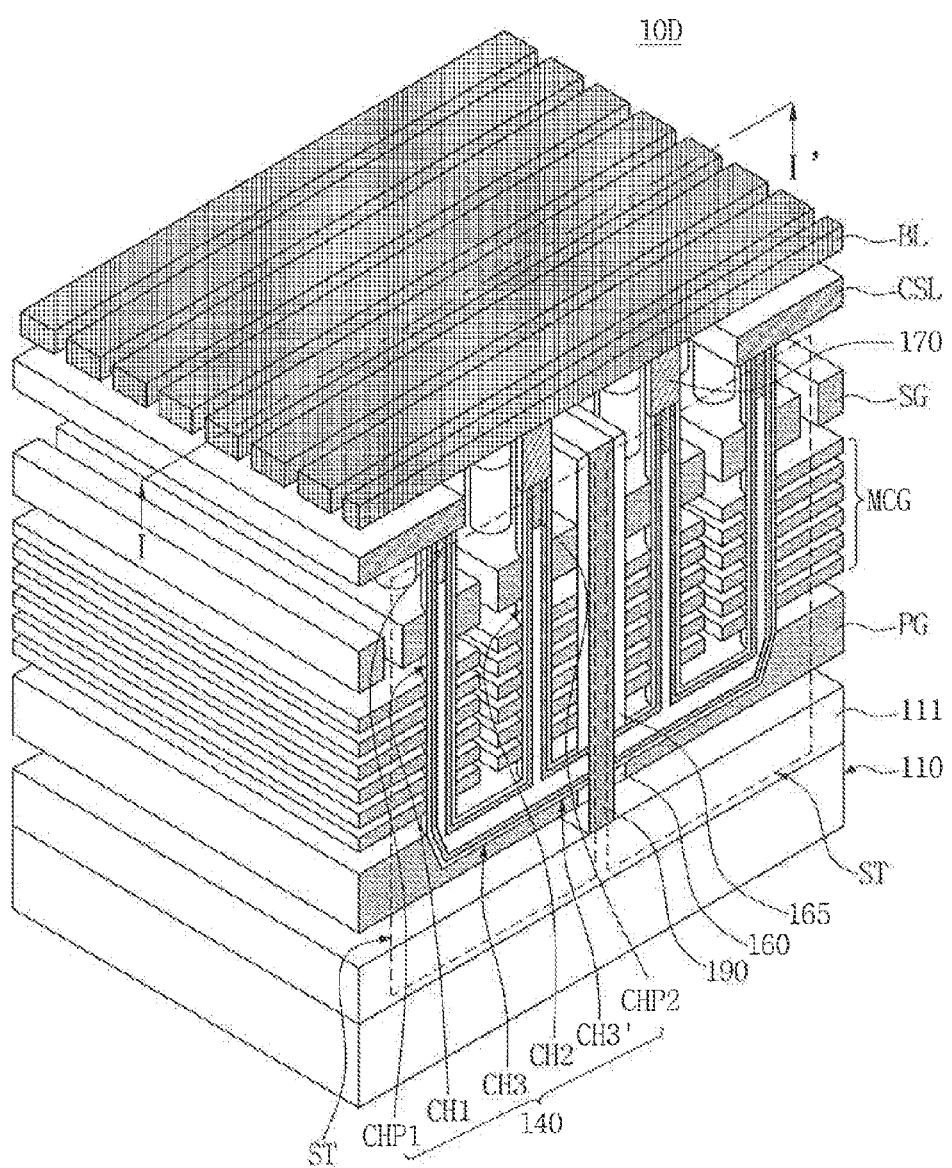
FIG. 4A is a perspective view of a non-volatile memory device in accordance with an exemplary embodiment of the inventive concept.
Figure 4B:
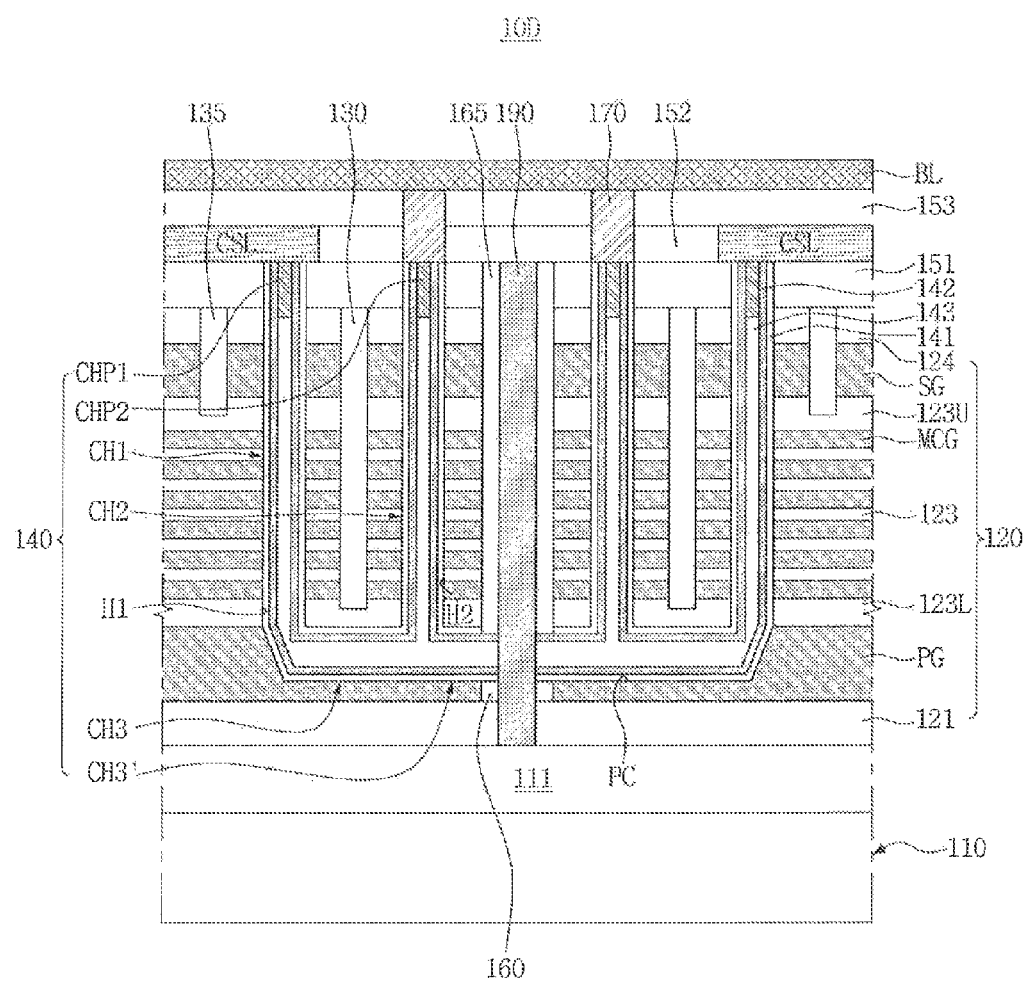
FIG. 4B is a vertical cross-sectional view taken along line I-I' shown in FIG. 4A.

FIG. 4A is a perspective view of a non-volatile memory device in accordance with an exemplary embodiment of the inventive concept, and FIG. 4B is a vertical cross-sectional view taken along line I-I' shown in FIG. 4A. Since a non-volatile memory device 10D in accordance with an exemplary embodiment is the same as the non-volatile memory device 10A shown in FIGS. 1A and 1B except that a layered structure 120 and a channel structure 140 are different from those of FIGS. 1A and 1B, and a substrate extending part 190 is further included, detailed descriptions of the same components may be omitted.

Referring to FIGS. 4A and 4B, the non-volatile memory device 10D may include a substrate 110 having a well 111, the layered structure 120, channel isolation patterns 130, the channel structures 140, the substrate extending part 190. Further, the non-volatile memory device 10D may include select line isolation patterns 135, first to third capping layers 151, 152, and 153, device isolation patterns 160, spacers 165, bit plugs 170, and bit lines BL.

The substrate 110 may include a single-crystalline silicon wafer, a silicon-on-insulator (SOI) wafer, a silicon-germanium wafer, etc. The well 111 may include an N-well or a P-well.

The layered structure 120 may include a plurality of interlayer insulating layers 121, 123L, 123, 123U, and 124 stacked over the well 111. The layered structure 120 may include a pipe gate electrode PG, a plurality of memory-cell gate electrodes MCG, and a select gate electrode SG, which are sequentially formed over the well 111, between the plurality of interlayer insulating layers 121, 123L, 123, 123U, and 124.

The select gate electrode SG and the pipe gate electrode PG may be relatively thicker than the plurality of memory-cell gate electrodes MCG. The plurality of memory-cell gate electrodes MCG includes six layers, but the present inventive concept is not limited thereto. For example, the number of layers in the memory-cell gate electrodes MCG may be greater or smaller.

The gate electrodes PG, MCG, and SG may include polysilicon, a metal, a metal compound, or a metal alloy. The metal, for example, may include tungsten (W). When the gate electrodes PG, MCG, and SG have metals, a barrier metal layer, such as titanium nitride (TiN) layer, may be further formed between the gate electrodes PG, MCG, and SG and the interlayer insulating layers 121, 123L, 123, 123U, and 124, and between the gate electrodes PG, MCG, and SG and the channel structure 140 which will be described later.

The plurality of interlayer insulating layers 121, 123L, 123, 123U, and 124, for example, may include a lowermost interlayer insulating layer 121 formed between the well 111 and the pipe gate electrode PG. The plurality of interlayer insulating layers 121, 123L, 123, 123U, and 124 may include intermediate interlayer insulating layers 123L, 123, and 123U formed between and/or over and under the memory-cell gate electrodes MCG. The intermediate interlayer insulating layers 123L, 123, and 123U may include a lowermost intermediate interlayer insulating layer 123L formed between the pipe gate electrode PG and the lowermost memory-cell gate electrode MCG, and an uppermost intermediate interlayer insulating layer 123U formed between the select gate electrode SG and the uppermost memory-cell gate electrode MCG. The plurality of interlayer insulating layers 121, 123L, 123, 123U, and 124 may include an upper interlayer insulating layer 124 formed on the select gate electrode SG. The lowermost intermediate interlayer insulating layer 123L, the uppermost intermediate interlayer insulating layer 123U, and the upper interlayer insulating layer 124 may be relatively thicker than the other interlayer insulating layers 121 and 123.

The plurality of interlayer insulating layers 121, 123L, 123, 123U, and 124 may insulate the gate electrodes PG, MCG, and SG. The plurality of interlayer insulating layers 121, 123L, 123, 123U, and 124, for example, may include silicon oxide.

Each of the channel structures 140 may include first and second vertical channels CH1 and CH2, a pipe channel CH3, and channel pads CHP1 and CHP2. Each channel structure 140 may have a single string ST.

The first and second vertical channels CH1 and CH2 each may vertically pass through the layered structure 120, and be connected to the pipe channel CH3 formed in the pipe gate electrode PG. For example, the first and second vertical channels CH1 and CH2 each may protrude from the pipe gate electrode PG. The first and second vertical channels CH1 and CH2 each may vertically pass through the layered structure 120, and may be formed in first and second channel holes H1 and H2 connected to a pipe connection space PG in which the pipe channel CH3 is formed. The first and second channel holes H1 and H2 may be horizontally spaced apart from each other in a top view.

The pipe channel CH3 may connect the first and second vertical channels CH1 and CH2. The pipe channel CH3 may be formed in the pipe connection space PG to horizontally connect to bottoms of the first and second vertical channels CH1 and CH2 in the pipe gate electrode PG. The pipe connection space PG may horizontally extend to be greater than a distance between the first and second vertical channels CH1 and CH2. Thus, the pipe channel CH3 may have a pipe channel extending part CH3' of which a side horizontally extends. The pipe gate electrode PG may surround side surfaces and a bottom surface of the pipe channel CH3. The pipe gate electrode PG may surround a part of a side surface and a part of a bottom surface of the pipe channel extending part CH3'.

The channel structure 140 may include a gate insulating pattern 141 conformally formed on inside walls of the first and second channel holes H1 and H2 and the pipe connection space PG. The channel structure 140 may include a channel active pattern 142 conformally formed on the gate insulating pattern 141. Further, the channel structure 140 may include a channel core pattern 143 filling the first and second channel holes H1 and H2 and the pipe connection space PG on the channel active pattern 142.

The substrate extending part 190 may contact the well 111, and protrude from the well 111. A part of a side surface of the substrate extending part 190 may contact the pipe channel extending part CH3'. An upper surface of the substrate extending part 190 may be coplanar with upper surfaces of the first and second vertical channels CH1 and CH2 of the channel structure 140. The substrate extending part 190 may include polysilicon, a metal, or a metal alloy. The metal, for example, may include tungsten (W). The channel structure 140 may contact the well 111 through the substrate extending part 190.

The spacer 165 may be formed between the layered structure 120 and the substrate extending part 190. The spacer 165 may be formed between the select gate electrode SG and the plurality of memory-cell gate electrodes MCG, and the substrate extending part 190.

The device isolation pattern 160 may be formed between the pipe gate electrode PG and the substrate extending part 190. A side surface of the spacer 165 and a side surface of the device isolation pattern 160 may be vertically aligned with each other.

The channel pads CHP1 and CHP2, the channel isolation patterns 130, the select line isolation patterns 135, the first to third capping layers 151 to 153, common source lines CSL, the bit plugs 170, and the bit lines BL of the non-volatile memory device 10D are the same as the non-volatile memory device 10A shown in FIGS. 1A and 1B.

Figure 5A:
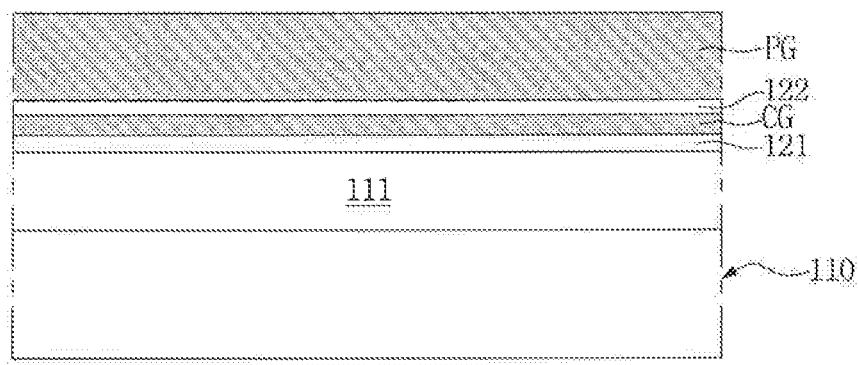
FIGS. 5A to 5V are vertical cross-sectional views taken along line I-I' shown in FIG. 1A according to an exemplary embodiment of the inventive concept.
Figure 5B:
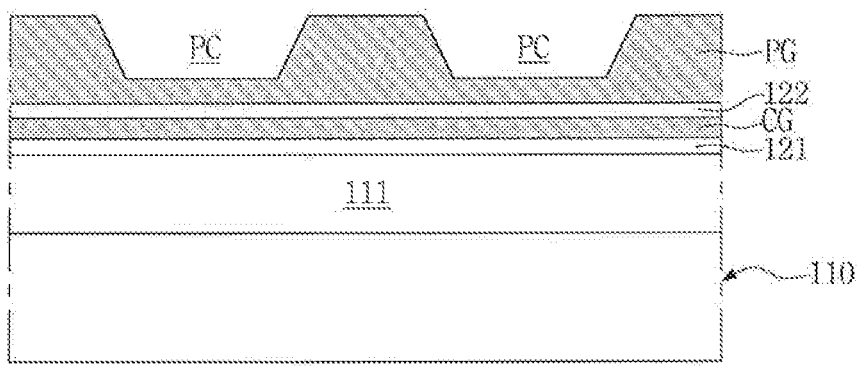
Figure 5C:
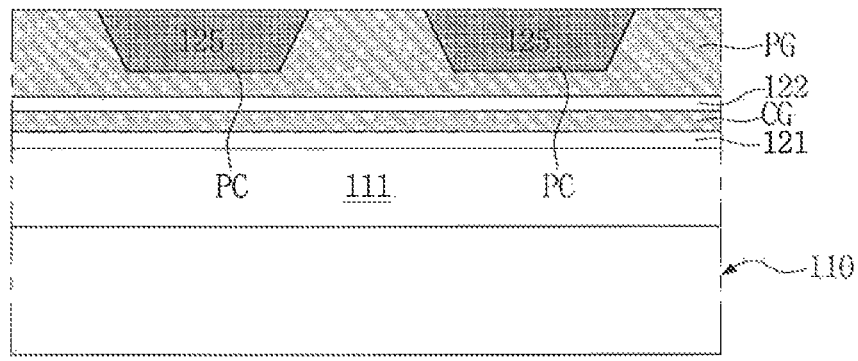
Figure 5D:
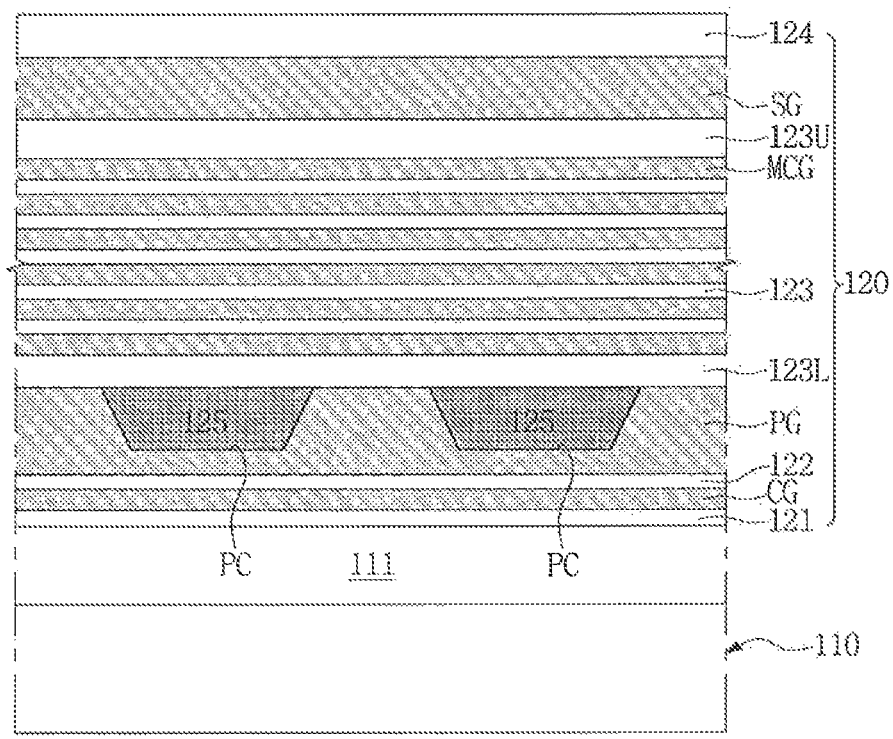
Figure 5E:
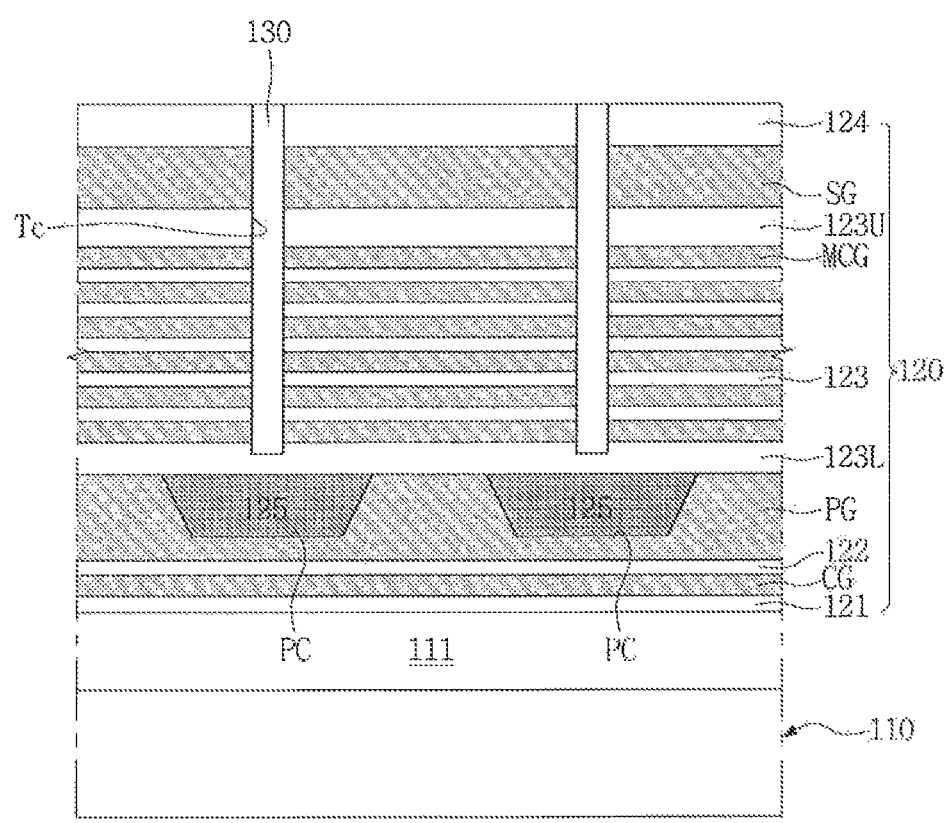
Figure 5F:
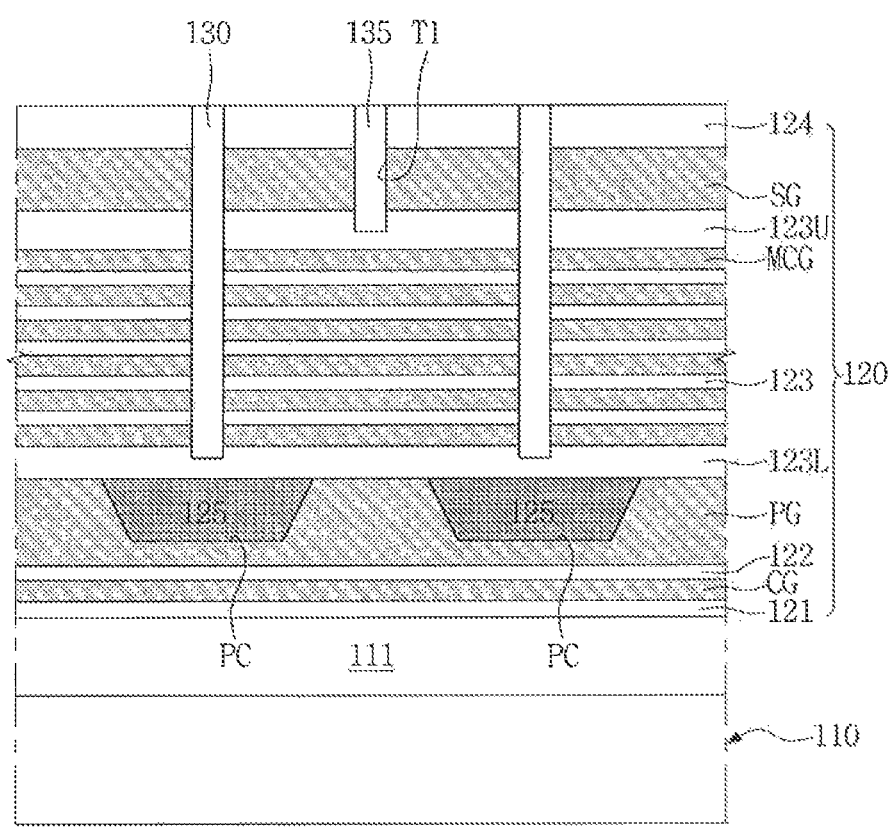
Figure 5G:
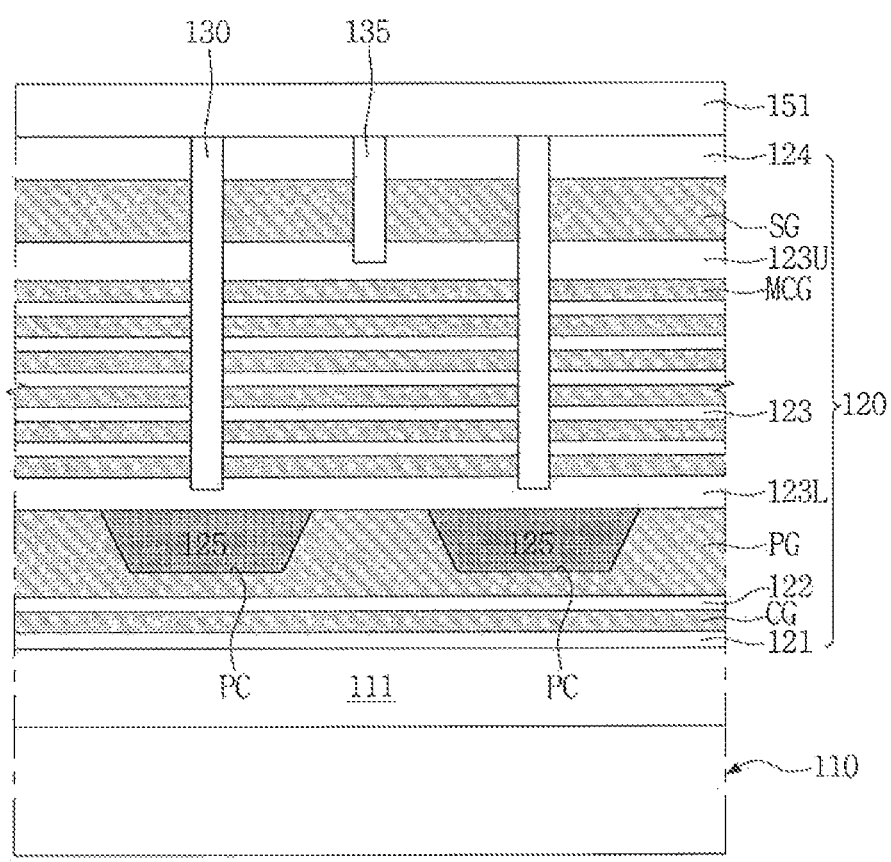
Figure 5H:
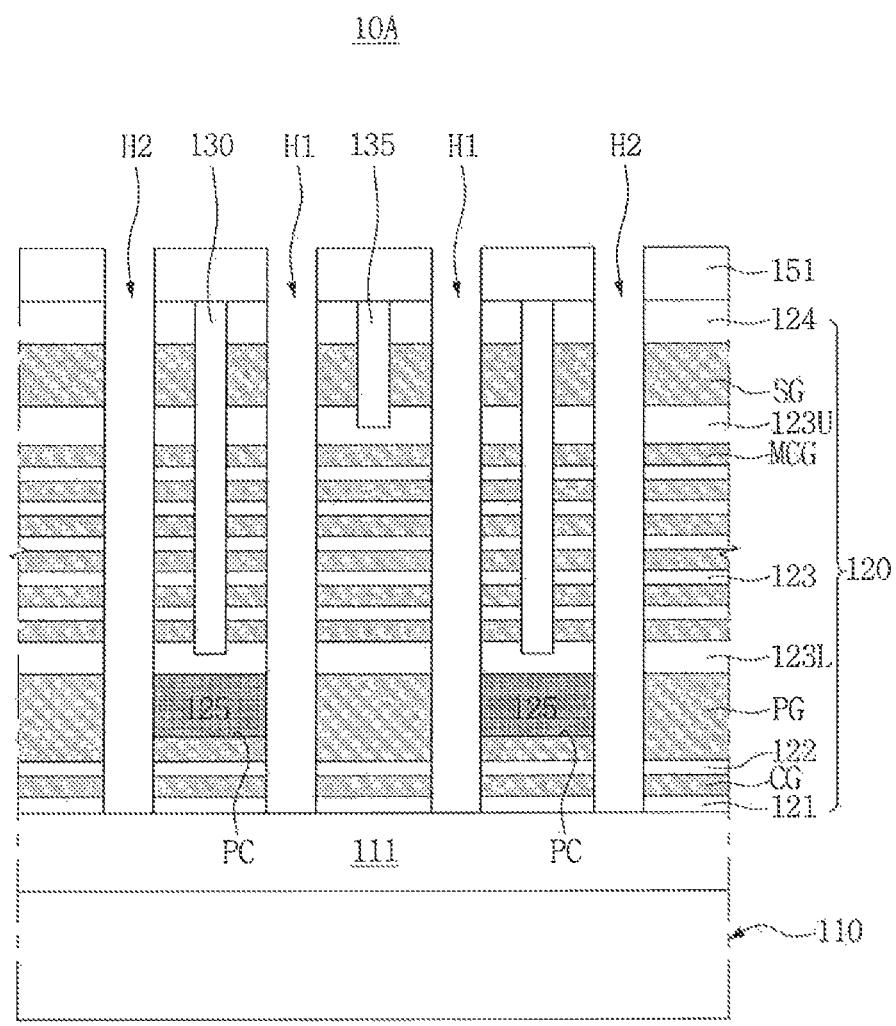
Figure 5I:
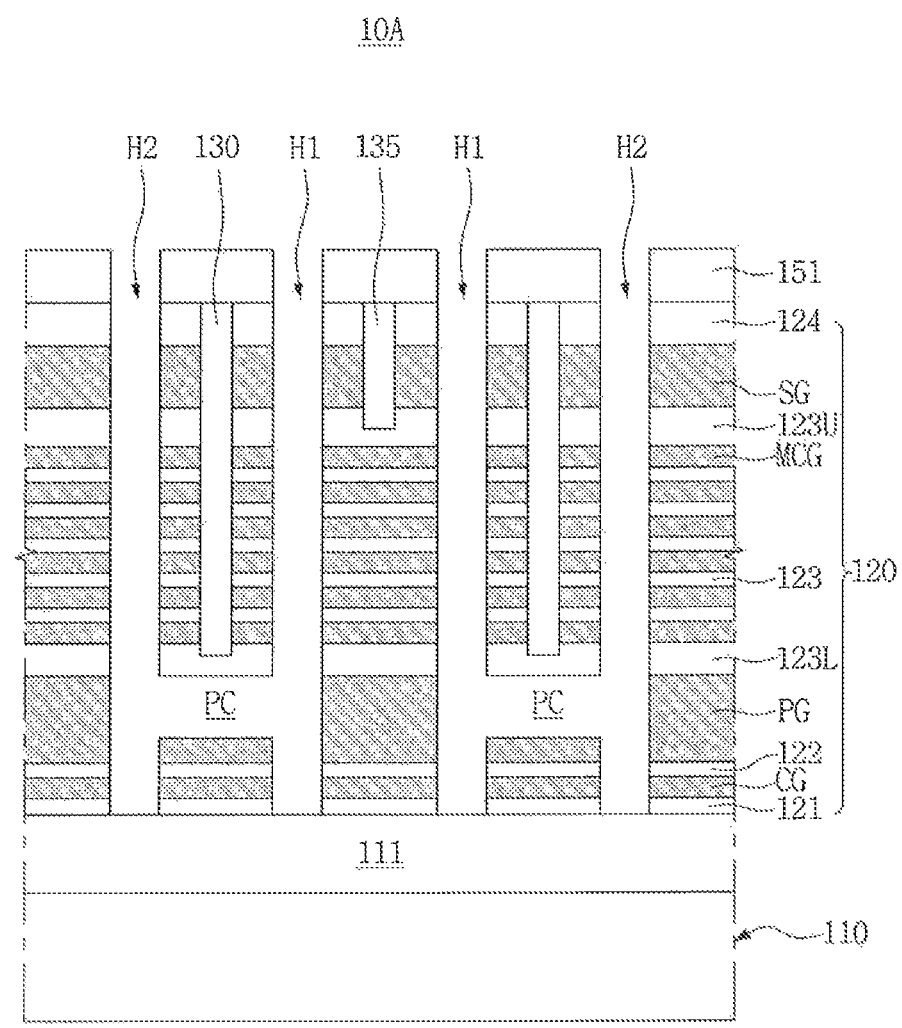
Figure 5J:
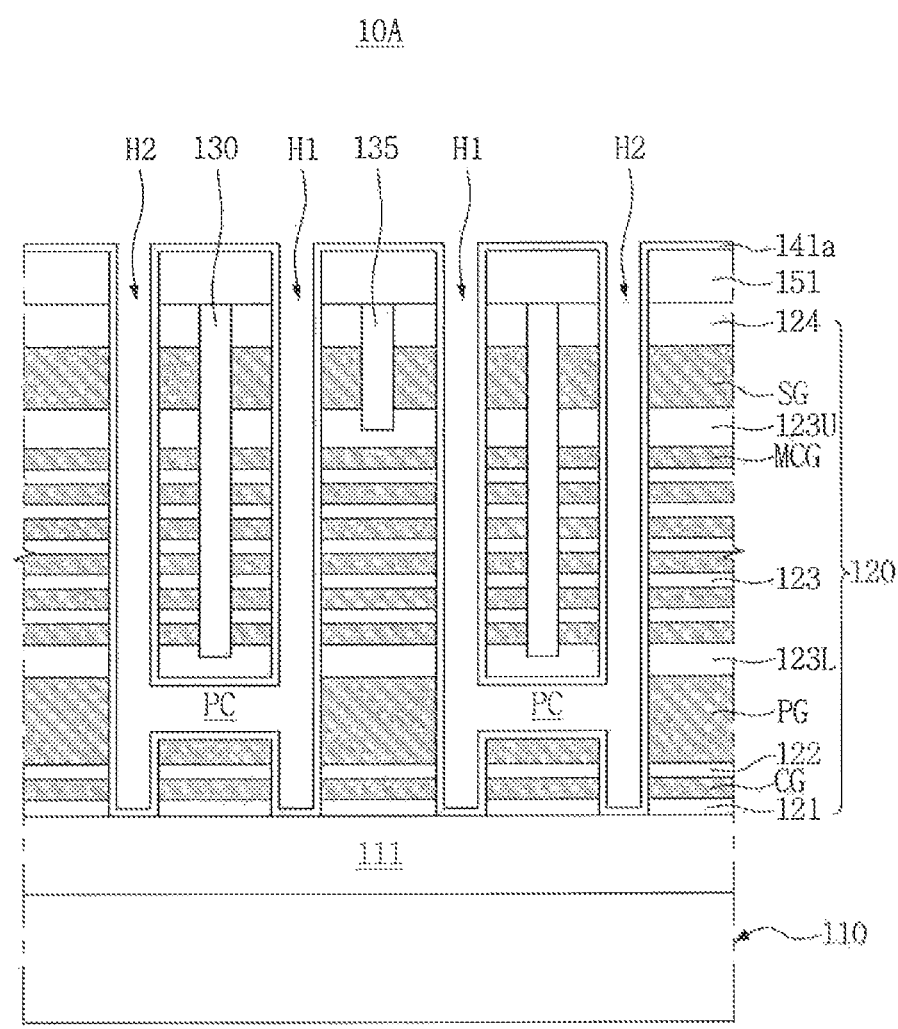
Figure 5K:
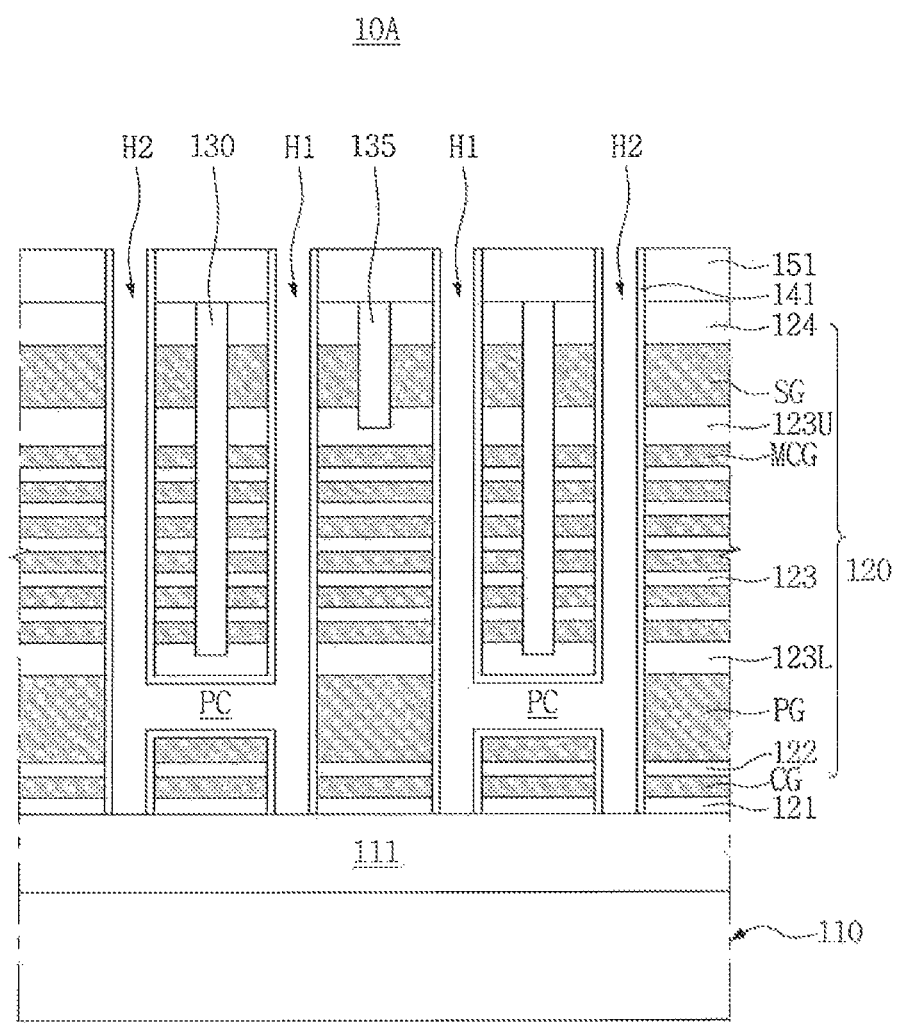
Figure 5L:
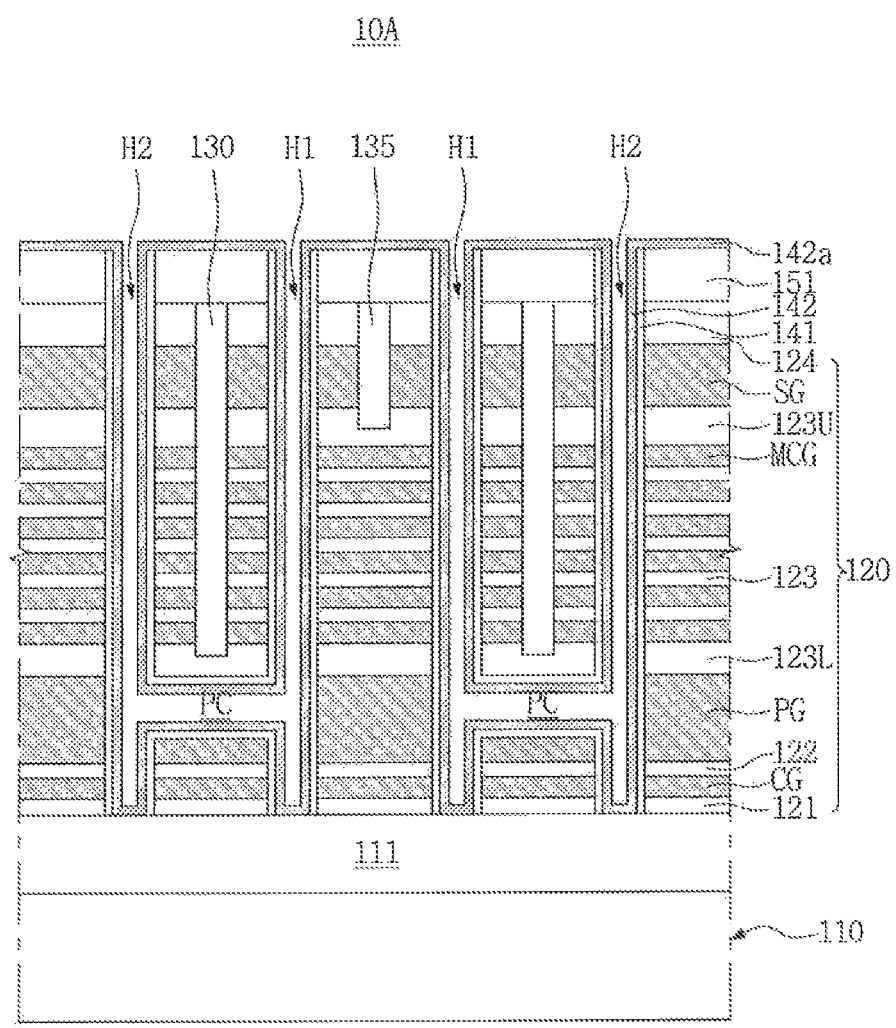
Figure 5M:
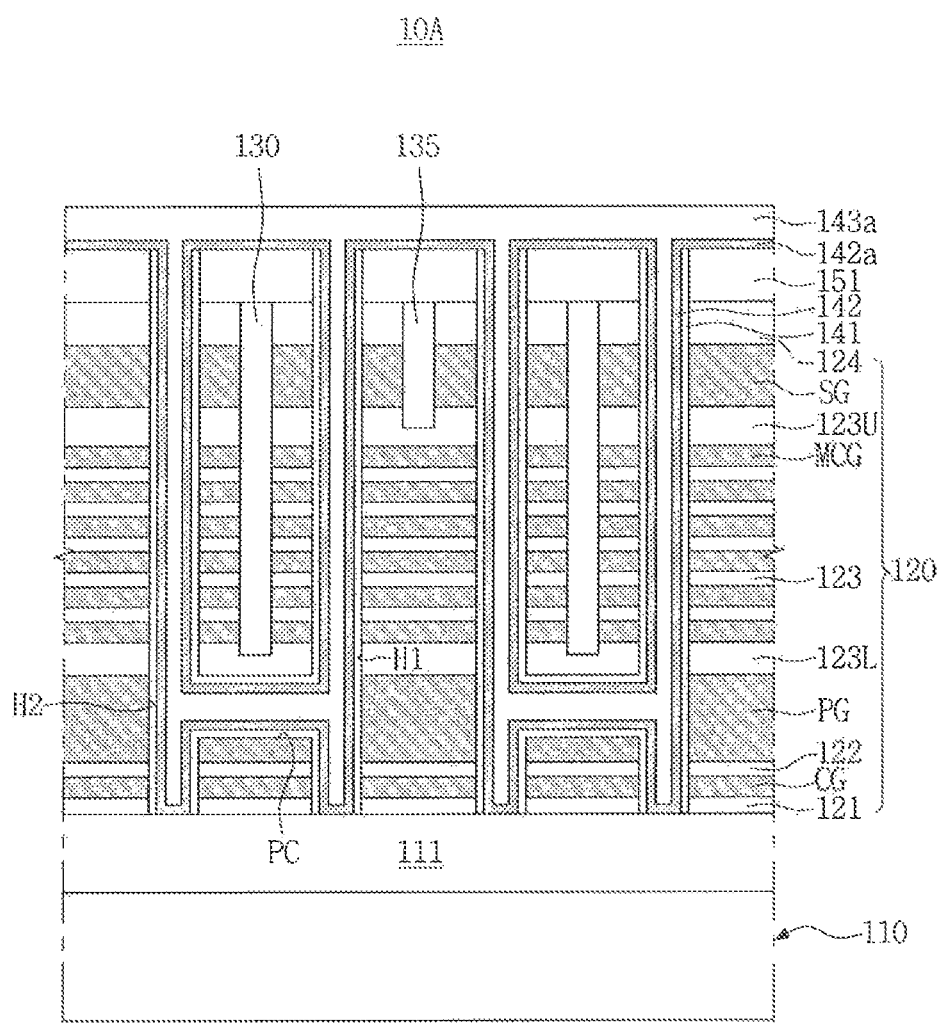
Figure 5N:
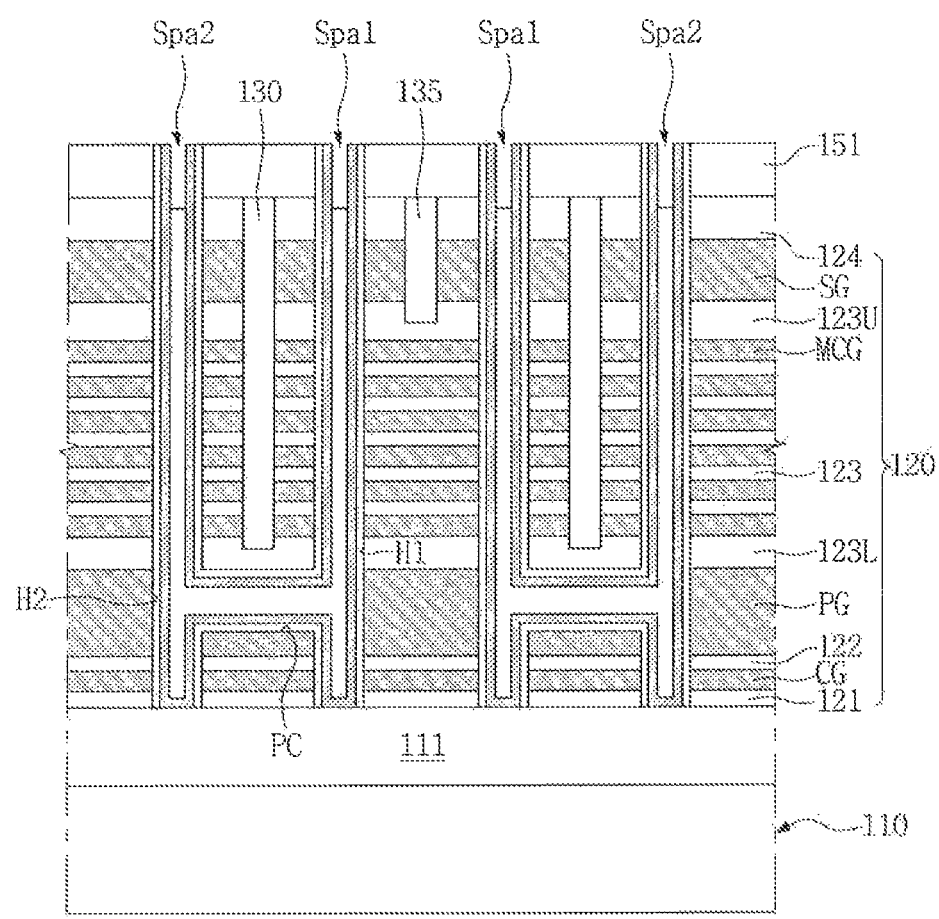
Figure 50:
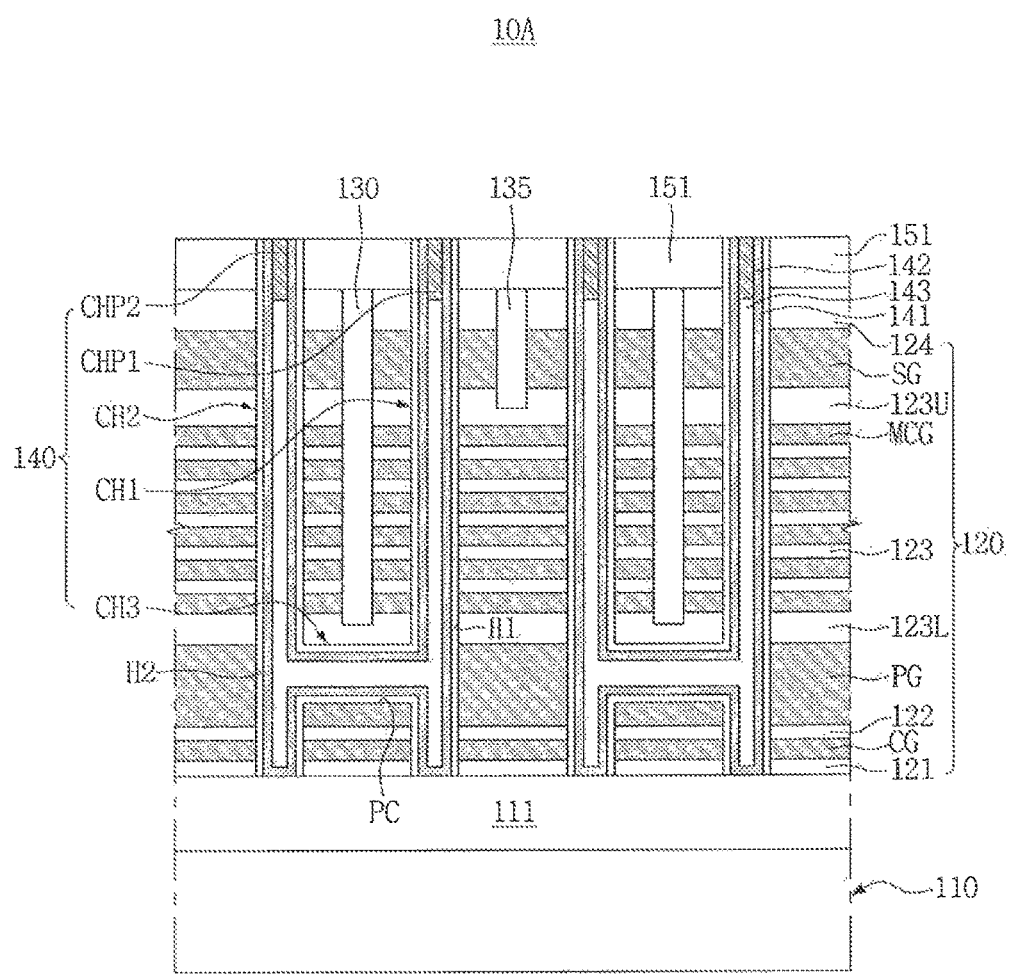
Figure 5P:
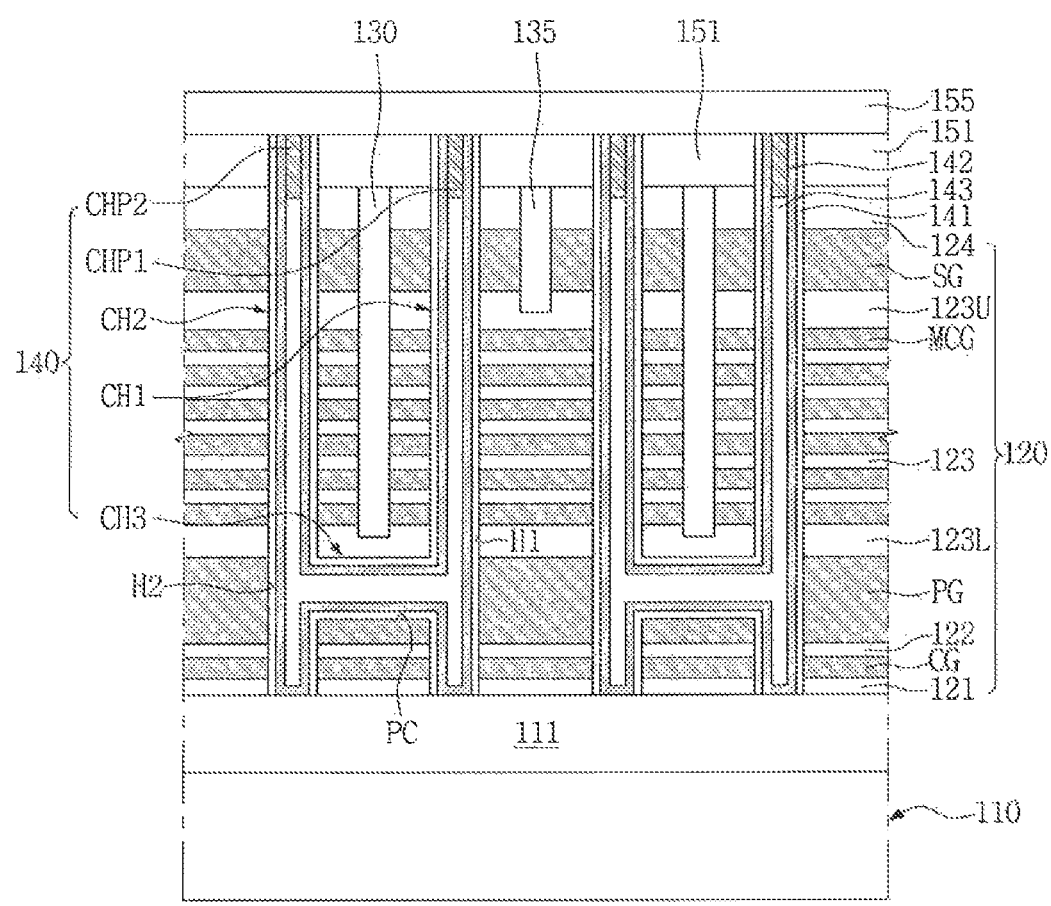
Figure 5Q:
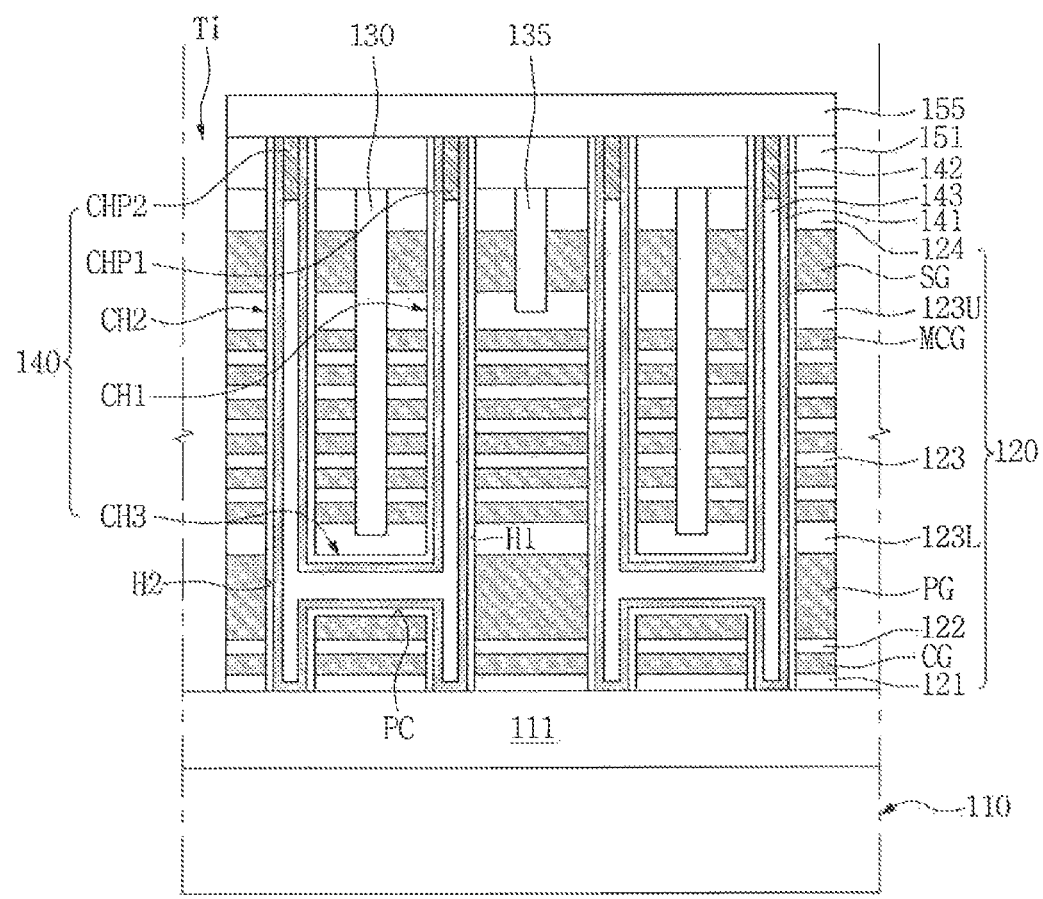
Figure 5R:
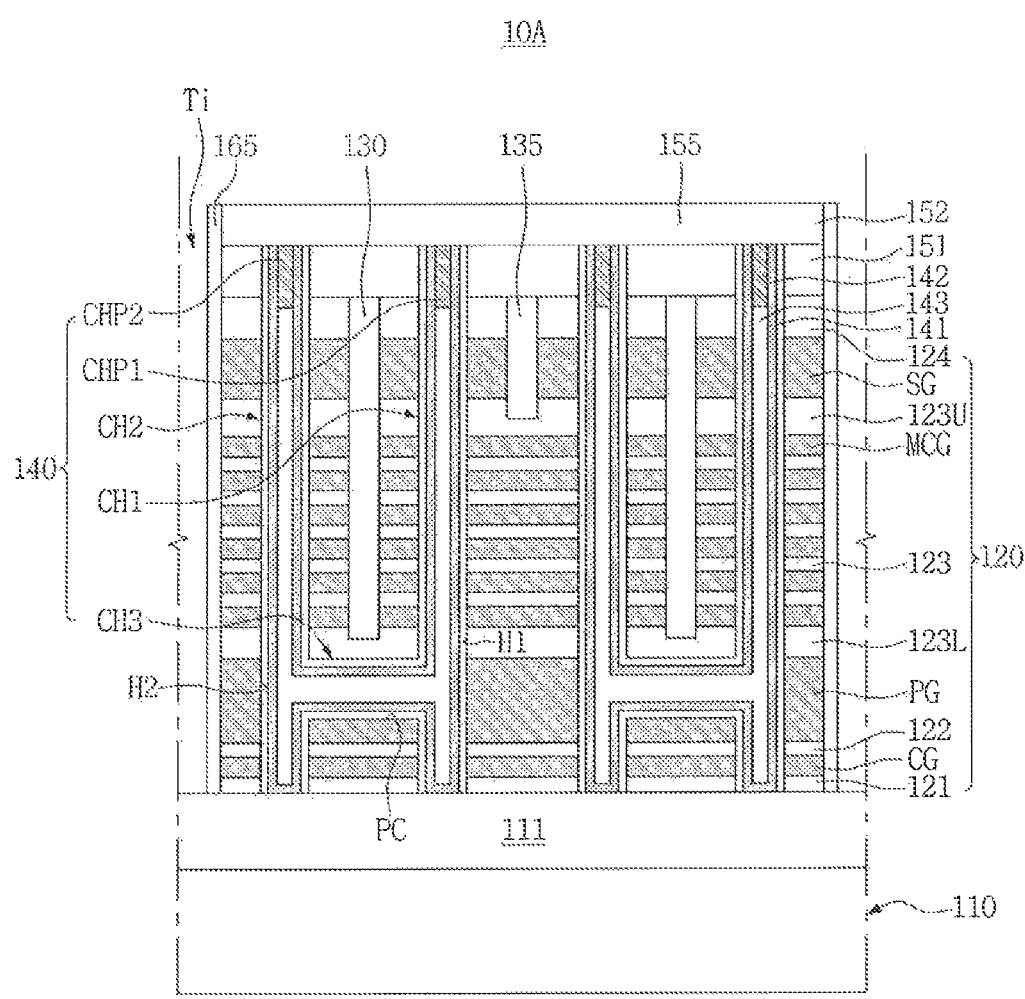
Figure 5S:
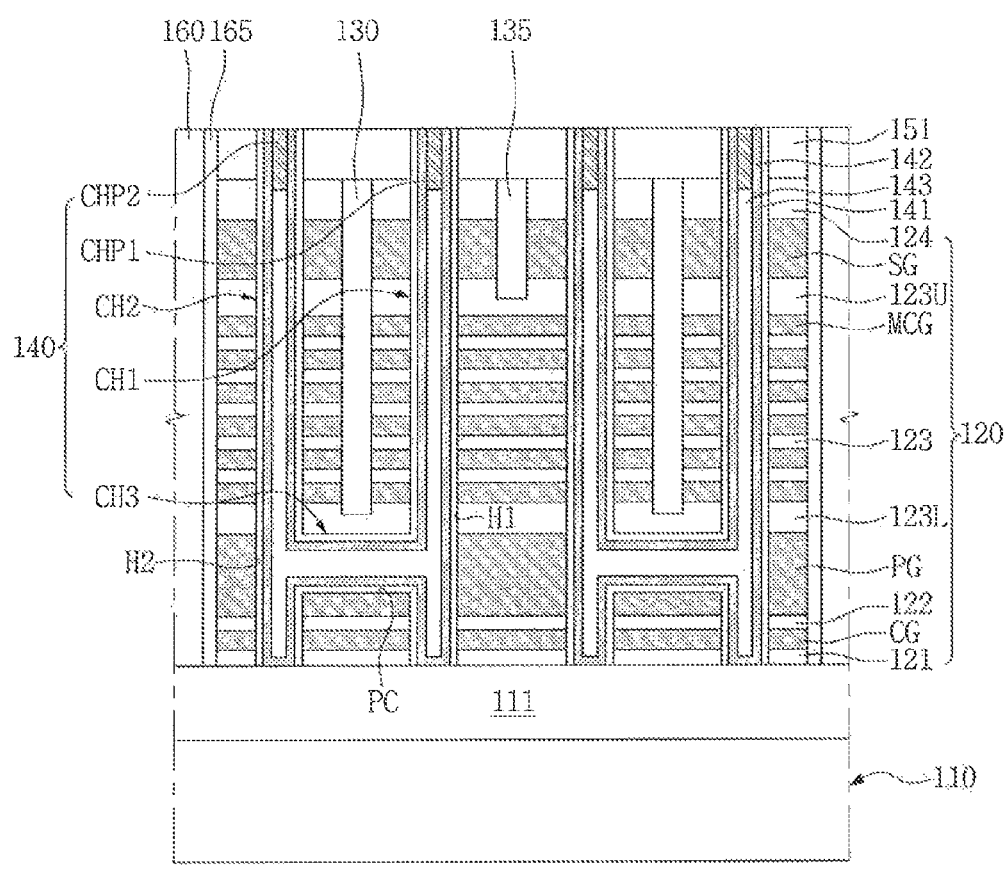
Figure 5T:
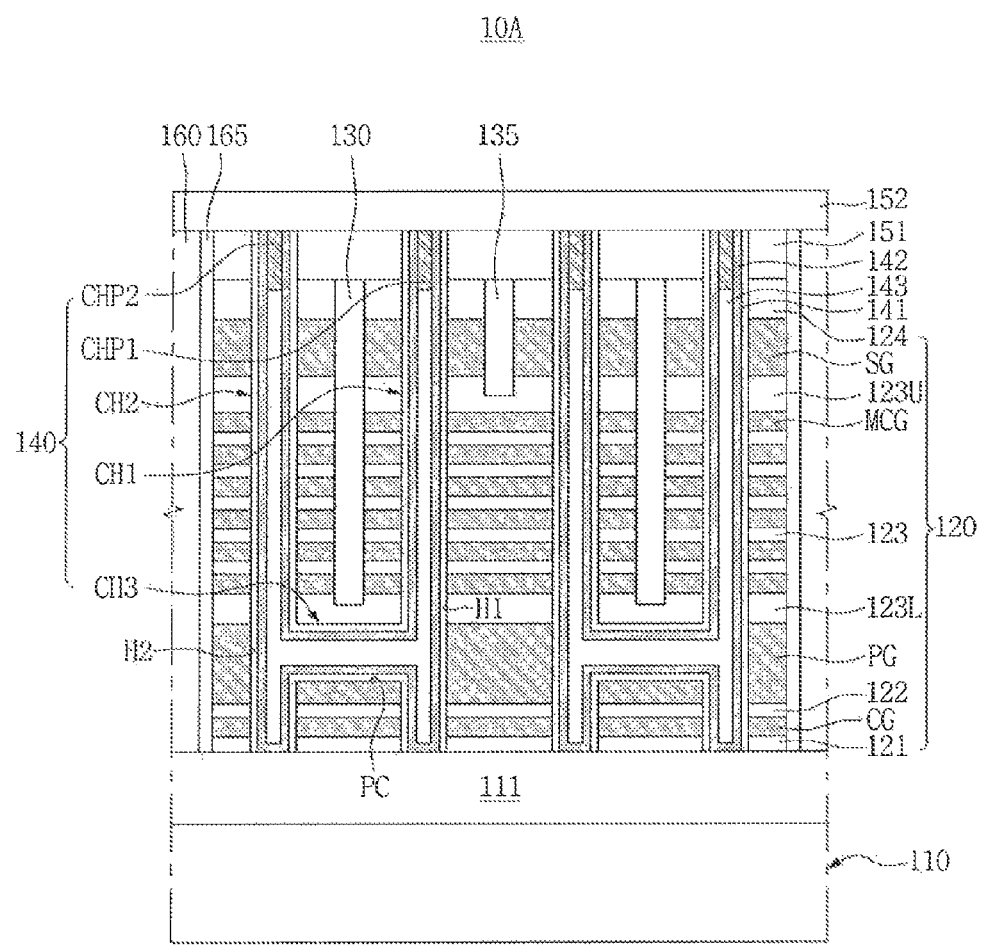
Figure 5U:
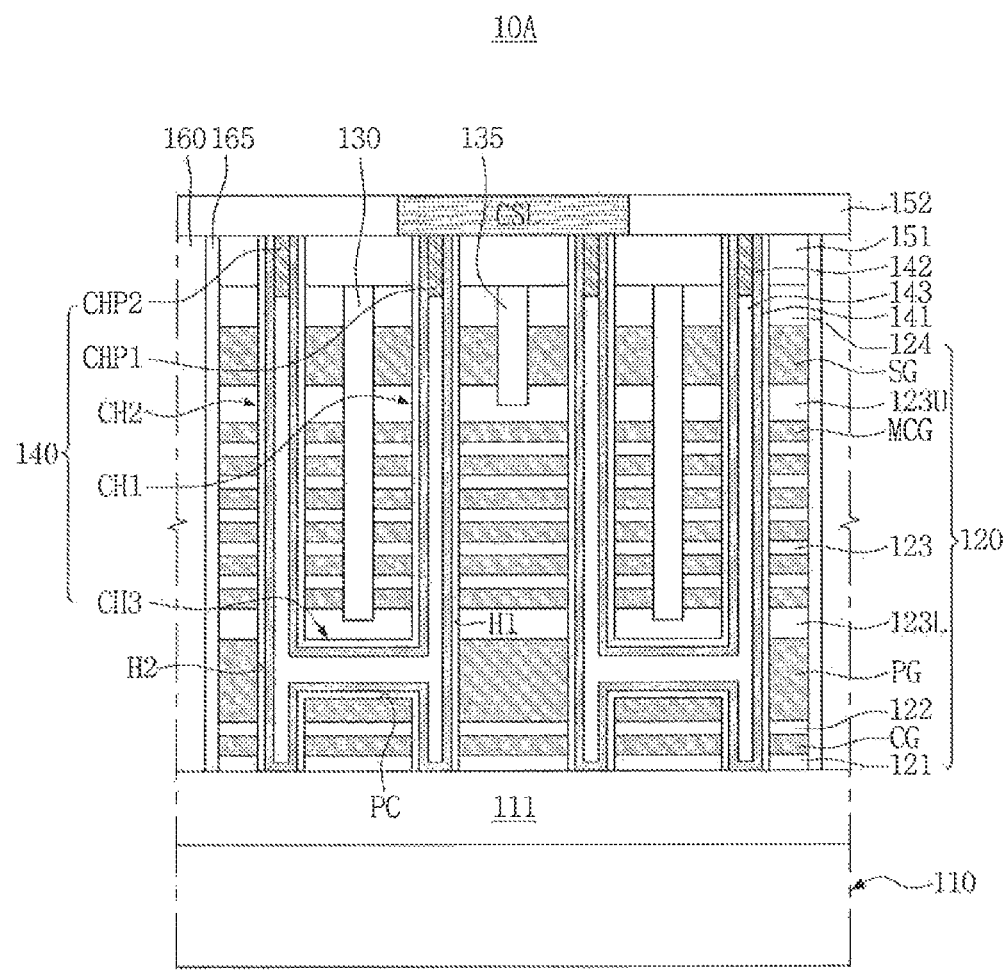
Figure 5V:
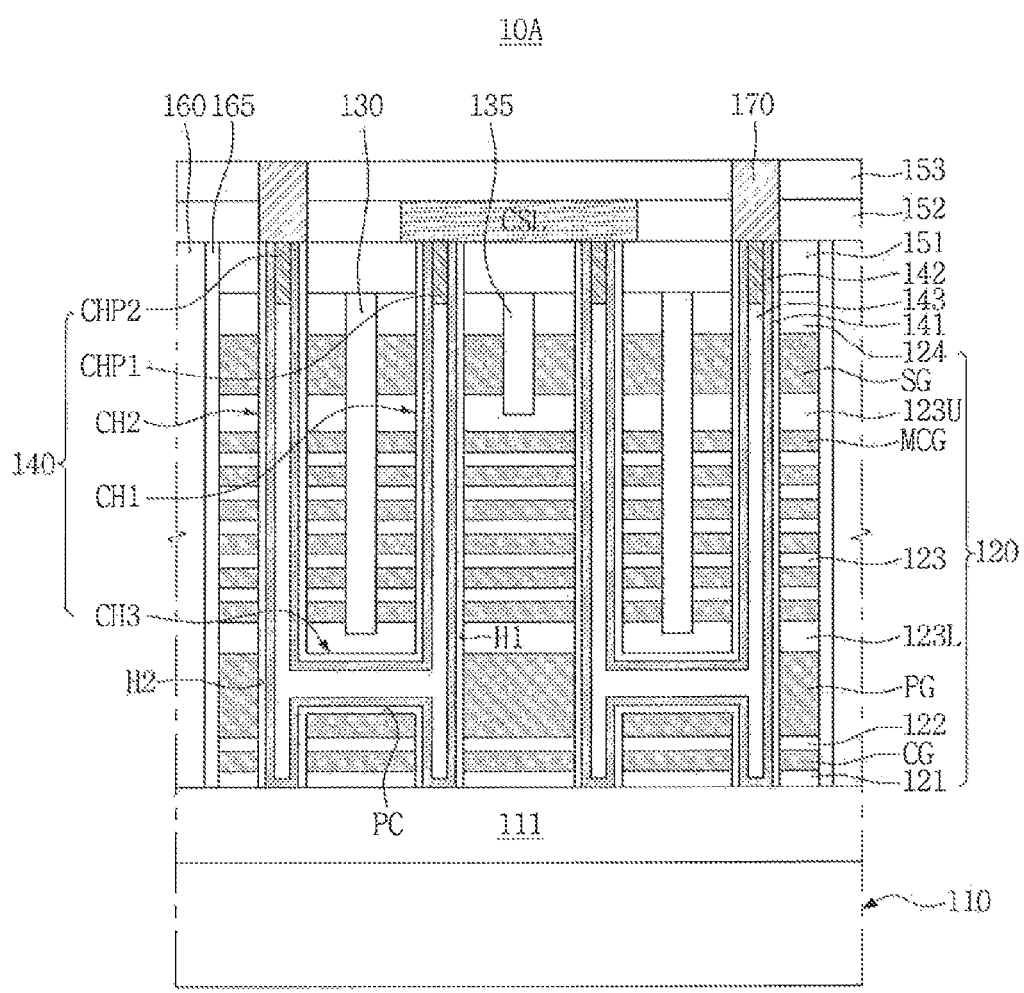

FIGS. 5A to 5V are vertical cross-sectional views taken along line I-I' shown in FIG. 1A in accordance with an exemplary embodiment of the inventive concept.

Referring to FIG. 5A, a method of manufacturing a non-volatile memory device 10A in accordance with an exemplary embodiment of the inventive concept may include forming a lowermost interlayer insulating layer 121 on a well 111 of a substrate 110, forming a cut-off gate electrode CG on the lowermost interlayer insulating layer 121, forming a lower interlayer insulating layer 122 on the cut-off gate electrode CG, and forming a pipe gate electrode PG on the lower interlayer insulating layer 122. The pipe gate electrode PG may be relatively thicker than the cut-off gate electrode CG. The lowermost interlayer insulating layer 121 and the lower interlayer insulating layer 122 may include silicon oxide. The cut-off gate electrode CG and the pipe gate electrode PG may include polysilicon, a metal, a metal compound, or a metal alloy. The metal, for example, may include tungsten (W).

Referring to FIG. 5B, the method may include forming a pipe connection spaces PG in the pipe gate electrode PG by performing an etching process.

Referring to FIG. 5C, the method may include filling the pipe connection spaces PG with a sacrificial layers 125. The sacrificial layers 125 may include silicon nitride (SiN) or silicon germanium (SiGe).

Referring to FIG. 5D, the method may include alternately and repeatedly forming a plurality of intermediate interlayer insulating layers 123L, 123, and 123U, and a plurality of memory-cell gate electrodes MCG on the pipe gate electrode PG and the sacrificial layers 125. The method may include forming a select gate electrode SG on the uppermost intermediate interlayer insulating layer 123U of the plurality of intermediate interlayer insulating layers 123L, 123, and 123U, and forming an upper interlayer insulating layer 124 on the select gate electrode SG.

The formation of the plurality of intermediate interlayer insulating layers 123L, 123, and 123U, and the upper interlayer insulating layer 124 may include forming silicon oxide layers by performing a deposition process. The uppermost intermediate interlayer insulating layer 123U and a lowermost intermediate interlayer insulating layer 123L of the plurality of intermediate interlayer insulating layers 123L, 123, and 123U, and the upper interlayer insulating layer 124 may be relatively thicker than the other intermediate interlayer insulating layers 123.

The formation of the plurality of memory-cell gate electrodes MCG and the select gate electrode SG may include forming polysilicon layers, metal layers, metal compound layers, or metal alloy layers by performing a deposition process. For example, the metal layers, for example, may include tungsten (W). The select gate electrode SG may be relatively thicker than the plurality of memory-cell gate electrodes MCG.

In this process, a layered structure 120 including the plurality of interlayer insulating layers 121, 122, 123L, 123, 123U, and 124, and the gate electrodes CG, PG, MCG, and SG may be formed.

Referring to FIG. 5E, the method may include forming channel isolation patterns 130 vertically passing through the upper interlayer insulating layer 124, the select gate electrode SG, the plurality of memory-cell gate electrodes MCG, and the plurality of intermediate interlayer insulating layers 123, and 123U.

The channel isolation patterns 130 are intended for separating first and second vertical channels CH1 and CH2 of a channel structure 140 which will be described later. To this end, the channel isolation patterns 130 may be formed to dispose between the first and second vertical channels CH1 and CH2. For example, the channel isolation patterns 130 may be disposed to vertically align with centers of the sacrificial layers 125 filled in the pipe connection spaces PG.

The formation of the channel isolation patterns 130 may include forming a channel isolation trenches Tc vertically passing through the upper interlayer insulating layer 124, the select gate electrode SG, the plurality of memory-cell gate electrodes MCG, and the plurality of intermediate interlayer insulating layers 123, and 123U by performing an etching process, and filling the channel isolation trenches Tc with an insulating material. Bottoms of the channel isolation trenches Tc may be located in the lowermost intermediate interlayer insulating layer 123L. The insulating material may include silicon oxide. The channel isolation patterns 130 may include the same material as the upper interlayer insulating layer 124 and the intermediate interlayer insulating layers 123L, 123, and 123U. Hereinafter, the drawing figure Tc, will be omitted for the convenience of description.

Referring to FIG. 5F, the method may include forming a select line isolation pattern 135 vertically passing through the select gate electrode SG. The select line isolation pattern 135 is intended for separating strings ST.

The formation of the select line isolation pattern 135 may include forming a select line isolation trench T1 vertically passing through the upper interlayer insulating layer 124, and the select gate electrode G, by performing an etching process, and filling the select line isolation trench T1 with an insulating material. A bottom of the select line isolation trench T1 may be located in the uppermost intermediate interlayer insulating layer 123U. The insulating material may include silicon oxide. The select line isolation pattern 135 may include the same material as the upper interlayer insulating layer 124 and the uppermost intermediate interlayer insulating layer 123U. Hereinafter, the drawing figure T1 will be omitted for the convenience of description.

Referring to FIG. 5G, the method may include forming a first capping layer 151 covering the channel isolation patterns 130 and the select line isolation pattern 135 on the upper interlayer insulating layer 124 by performing a deposition process. The first capping layer 151 may include silicon oxide.

Referring to FIG. 5H, the method may include forming first and second channel holes H1 and H2 vertically passing through the layered structure 120 and expose the well 111 by performing an etching process.

In this process, side surfaces of the sacrificial layers 125 may be exposed by the first and second channel holes H1 and H2.

Meanwhile, in this process, when the first and second channel holes H1 and H2 are formed to be recessed in the well 111, and the subsequent process is performed, the non-volatile memory device 10B shown in FIGS. 2A and 2B may be formed.

Further, after the first and second channel holes H1 and H2 are formed to be recessed in the well 111, a selective epitaxial growth layer 180 may be formed in the well 111 exposed in the first and second channel holes H1 and H2 by performing a selective epitaxial growth (SEG) process. In this case, the non-volatile memory device 10C shown in FIGS. 3A and 3B may be formed.

Referring to FIG. 5I, the method may include forming pipe connection spaces PG by removing the sacrificial layers 125 through the first and second channel holes H1 and H2.

The sacrificial layers 125 may be removed by an etchant provided through the first and second channel holes H1 and H2. When the sacrificial layers 125 include silicon nitride, phosphoric acid may be used as the etchant. When the sacrificial layers 125 include silicon germanium, ammonia may be used as the etchant.

Referring to FIG. 5J, the method may include conformally forming a gate insulating layer 141a on inside walls of the first and second channel holes H1 and H2, and the pipe connection spaces PG by performing a deposition process.

The gate insulating layer 141a is shown as a single layer in the drawing but need not be limited thereto, and be formed as a multilayer. For example, the gate insulating layer 141a may include a charge barrier layer, a charge trap layer, and a tunnel insulating layer, which are sequentially formed on the inside walls of the first and second channel holes H1 and H2, and the pipe connection spaces PG. The charge barrier layer, for example, may include silicon oxide. The charge trap layer, for example, may include silicon nitride or a high-k dielectric material. The high-k dielectric material may include aluminum oxide (AlO), zirconium oxide (ZrO), hafnium oxide (HfO), or lanthanum oxide (LaO). The tunnel insulating layer, for example, may include silicon oxide.

Referring to FIG. 5K, the method may include removing the gate insulating layer 141a to open bottoms of the first and second channel holes H1 and H2 and expose the well 111 by performing an etch-back process, and forming gate insulating pattern 141. Here, the gate insulating layer 141a formed on the first capping layer 151 may also be removed, and an upper part of the first capping layer 151 may be exposed.

Referring to FIG. 5L, the method may include conformally forming a channel active layer 142a on the gate insulating pattern 141 of the first and second channel holes H1 and H2 and pipe connection spaces PG, and on the well 111 exposed by the first and second channel holes H1 and H2 by performing a deposition process. The channel active layer 142a may include polysilicon.

Referring to FIG. 5M the method may include forming a channel core layer 143a filling the first and second channel holes H1 and H2, and the pipe connection spaces PG. The channel core layer 143a may include silicon oxide.

Referring to FIG. 5N, the method may include forming source-side and drain-side channel pad spaces Spa1 and Spa2 by recessing an upper portion of the channel core layer 143a by performing a planarization process such as an etch-back process and a chemical mechanical planarization (CMP) process.

In this process, the channel active layer 142a and the channel core layer 143a may be changed to a channel active pattern 142 and a channel core pattern 143.

Referring to FIG. 5O, the method may include forming source-side and drain-side channel pads CHP1 and CHP2 filling the inside of the source-side and drain-side channel pad spaces Spa1 and Spa2.

The source-side and drain-side channel pads CHP1 and CHP2 may include polysilicon which is doped with a high concentration N-type impurity. Side surfaces of the source-side and drain-side channel pads CHP1 and CHP2 may be surrounded by the corresponding channel active pattern 142.

In this process, a channel structure 140 having the first and second vertical channels CH1 and CH2, the pipe channel CH3, and the source-side and drain-side channel pads CHP1 and CHP2 may be formed.

Referring to FIG. 5P, the method may include forming a temporary capping layer 155 covering the channel structure 140 on the first capping layer 151 by performing a deposition process. The temporary capping layer 155 may include silicon oxide.

Referring to FIG. 5Q, the method may include forming device isolation trenches Ti vertically passing through the temporary capping layer 155 and the layered structure 120, and expose the well 111 by performing an etching process.

Referring to FIG. 5R, the method may include forming spacers 165 on inside walls of the device isolation trenches Ti. The spacers 165 may include silicon oxide or silicon nitride.

Referring to FIG. 5S, the method may include forming device isolation patterns 160 filling the device isolation trenches Ti, and removing the temporary capping layer 155 and exposing the first capping layer 151 by performing a planarization process such as a CMP process. The device isolation patterns 160 may include silicon oxide.

The device isolation patterns 160 may have a line shape in parallel with the channel isolation patterns 130 and the select line isolation pattern 135 in a top view.

Referring to FIG. 5T, the method may include forming a second capping layer 152 covering the device isolation patterns 160 and the channel structure 140 on the first capping layer 151 by performing a deposition process. The second capping layer 152 may include silicon oxide.

Referring to FIG. 5U, the method may include forming a common source line CSL passing through the second capping layer 152, and contacting the source-side channel pad CHP1 of the first vertical channel CH1. The common source line CSL may also be formed to commonly connect to a source-side channel pad arm of a first vertical channel CH1 of an adjacent channel structure 140. The common source line CSL may include a metal or a metal compound. The common source lines CSL may have line shapes in parallel in a top view. Further, the common source lines CSL may be in parallel with the channel isolation patterns 130, the select line isolation pattern 135, and the device isolation patterns 160.

Referring to FIG. 5V, the method may include forming a third capping layer 153 on the second capping layer 152 and the common source line CSL by performing a deposition process. The third capping layer 153 may include silicon oxide.

Further, the method may include forming bit plugs 170 vertically passing through the second and third capping patterns 152 and 153, and contact the drain-side channel pad patterns CHP2 of the second vertical channels CH2 of the channel structures 140.

The bit plugs 170 may include a metal compound or a metal silicide. Side surfaces of the bit plugs 170 may be surrounded by the second and third capping patterns 152 and 153.

Then, further referring to FIGS. 1A and 1B, the method may include forming bit lines BL electrically connected to the bit plugs 170 on the third capping layer 153. The bit lines BL may include a metal or a metal compound. The metal, for example, may include copper (Cu).

The bit lines BL may have line shapes in parallel in a top view. Further, the bit lines BL may be perpendicular to the common source line CSL, the channel isolation patterns 130, the select line isolation pattern 135, and the device isolation patterns 160 in a top view.

Figure 6A:
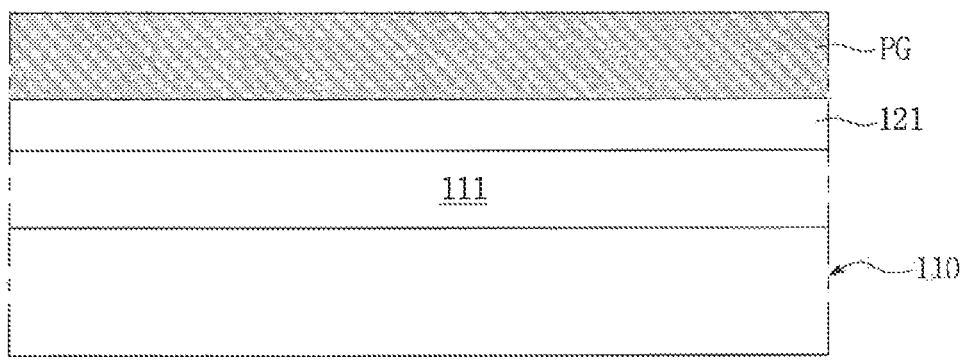
FIGS. 6A to 6X are vertical cross-sectional views taken along line I-I' shown in FIG. 4A according to an exemplary embodiment of the inventive concept.
Figure 6B:
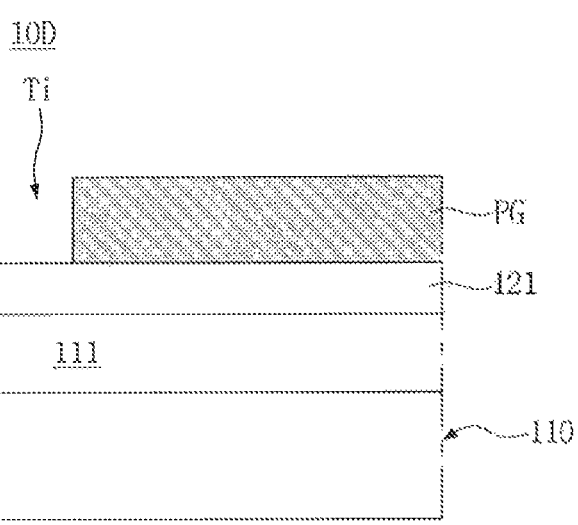
Figure 6C:
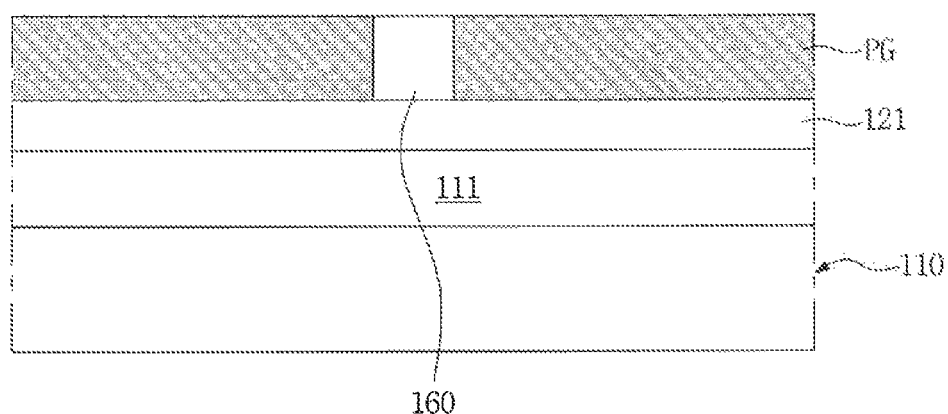
Figure 6D:
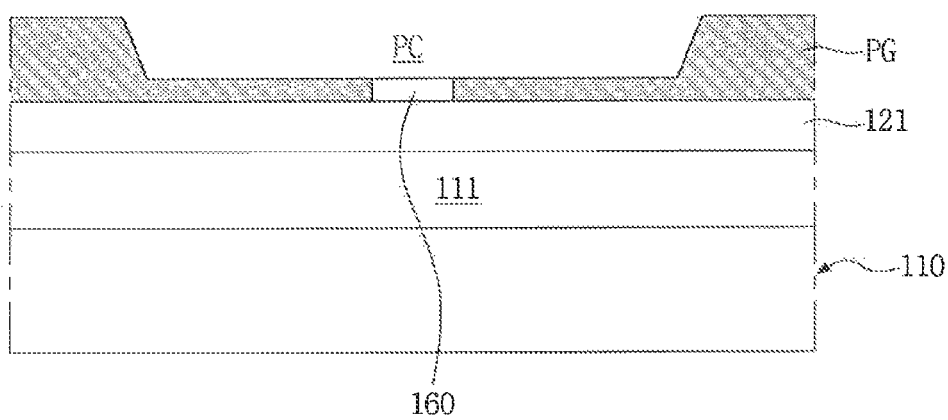
Figure 6E:
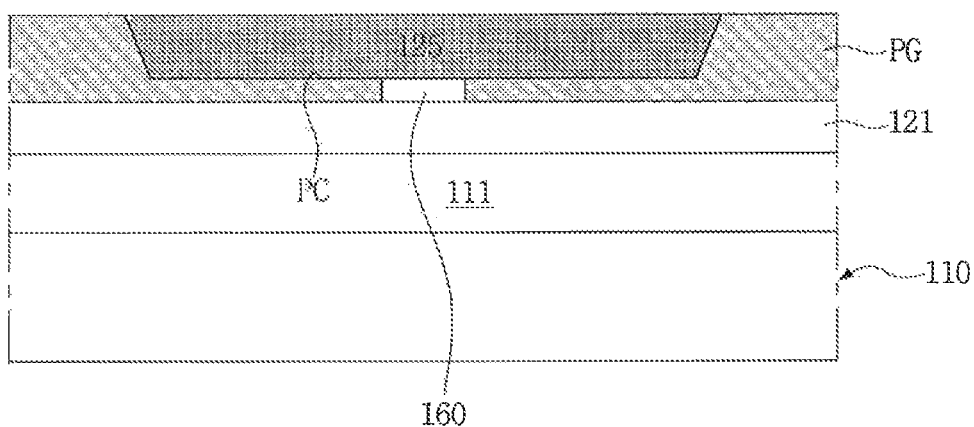
Figure 6F:
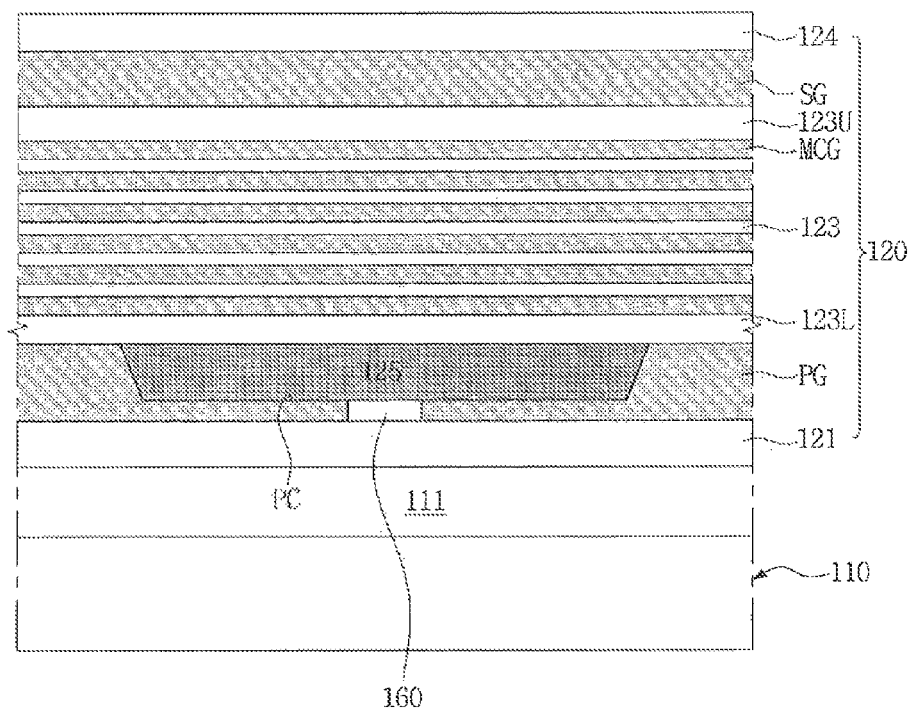
Figure 6G:
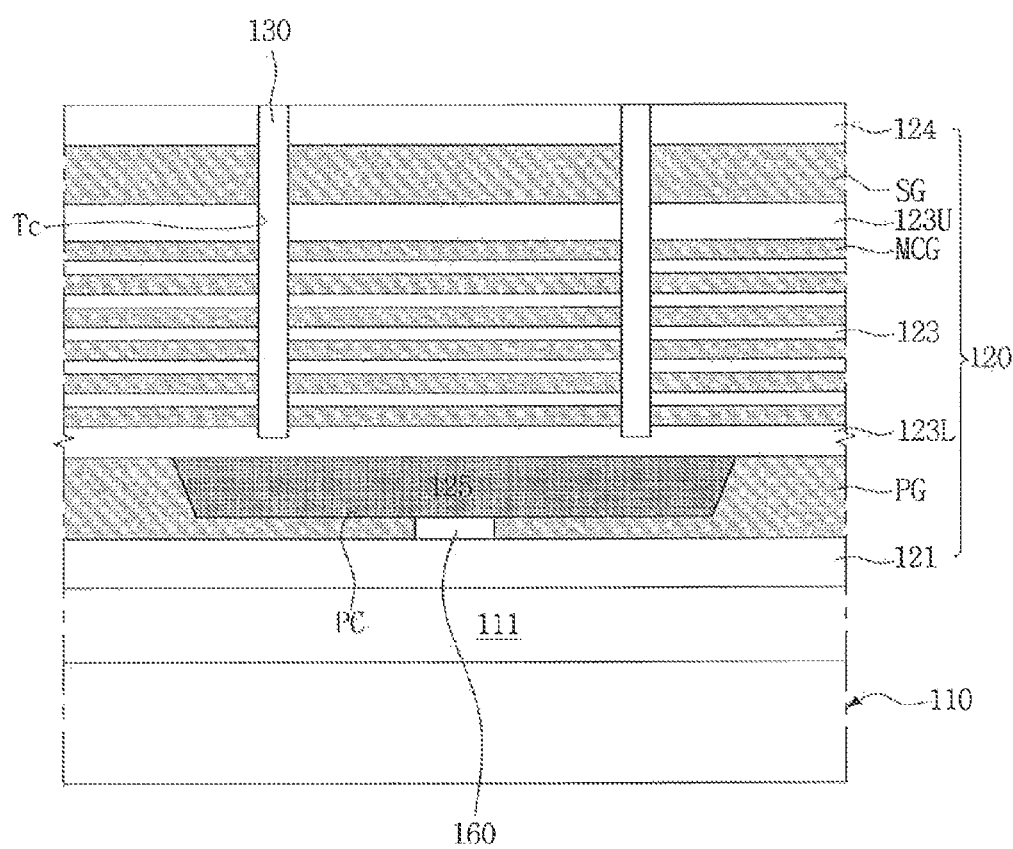
Figure 6H:
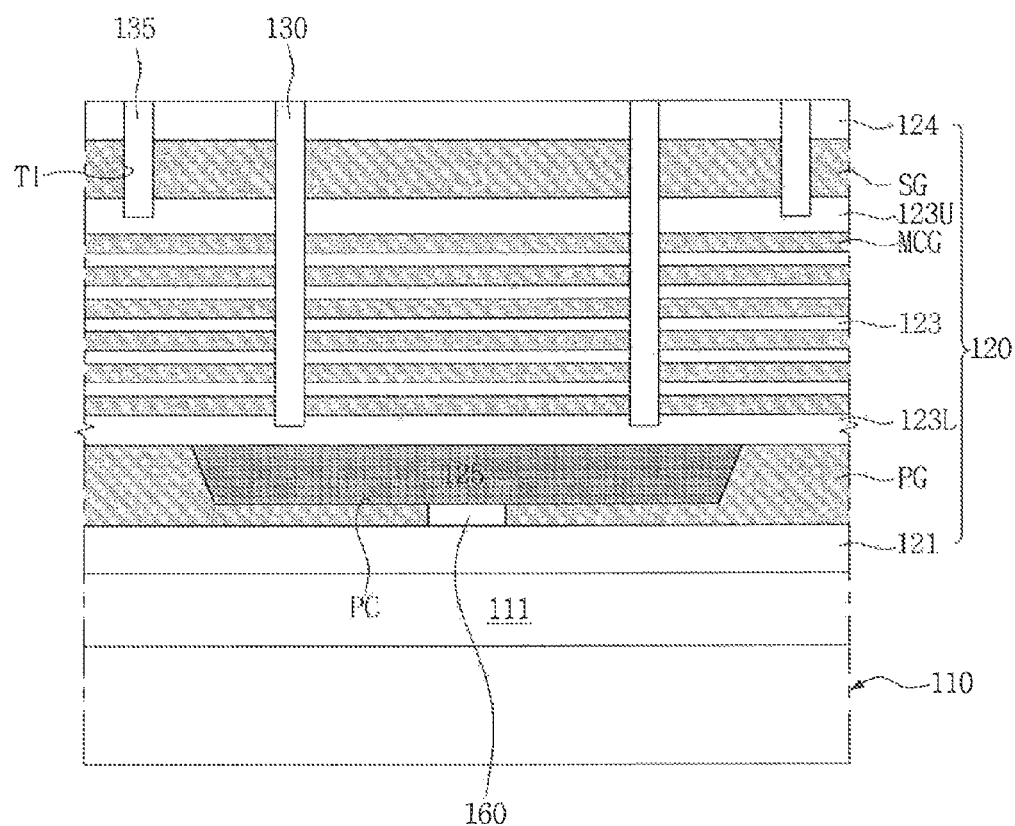
Figure 6I:
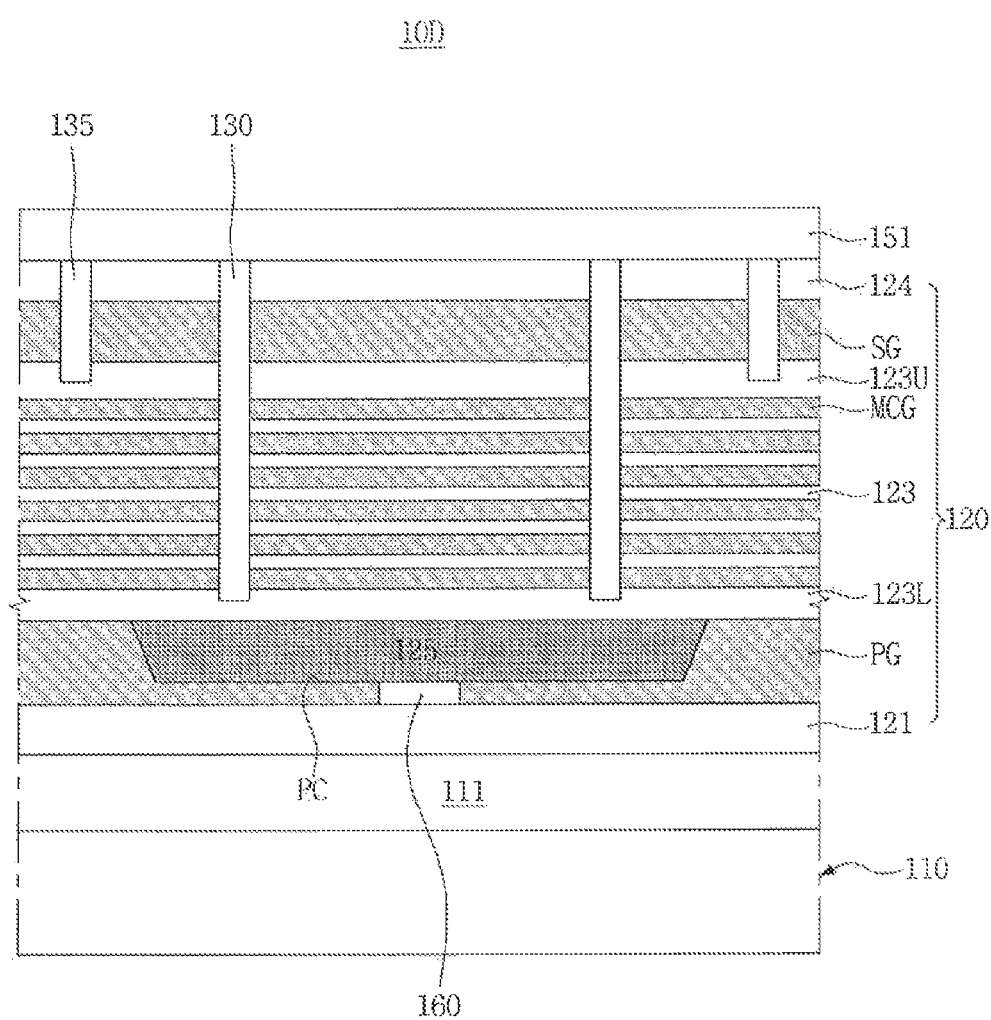
Figure 6J:
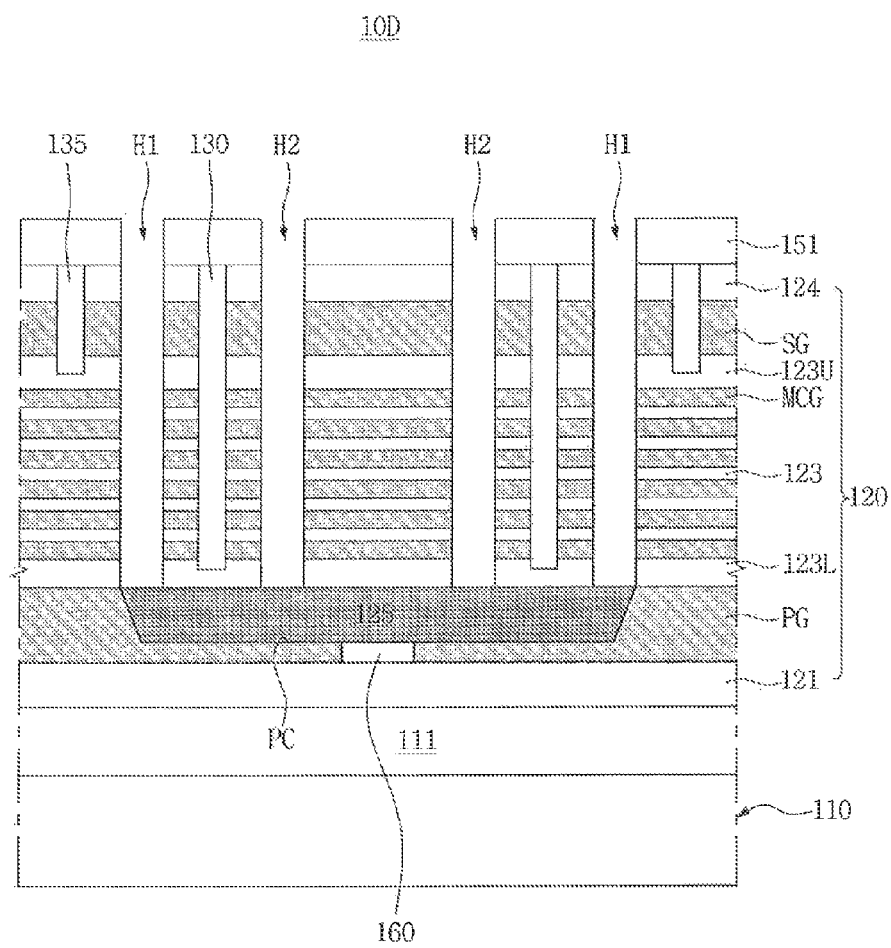
Figure 6K:
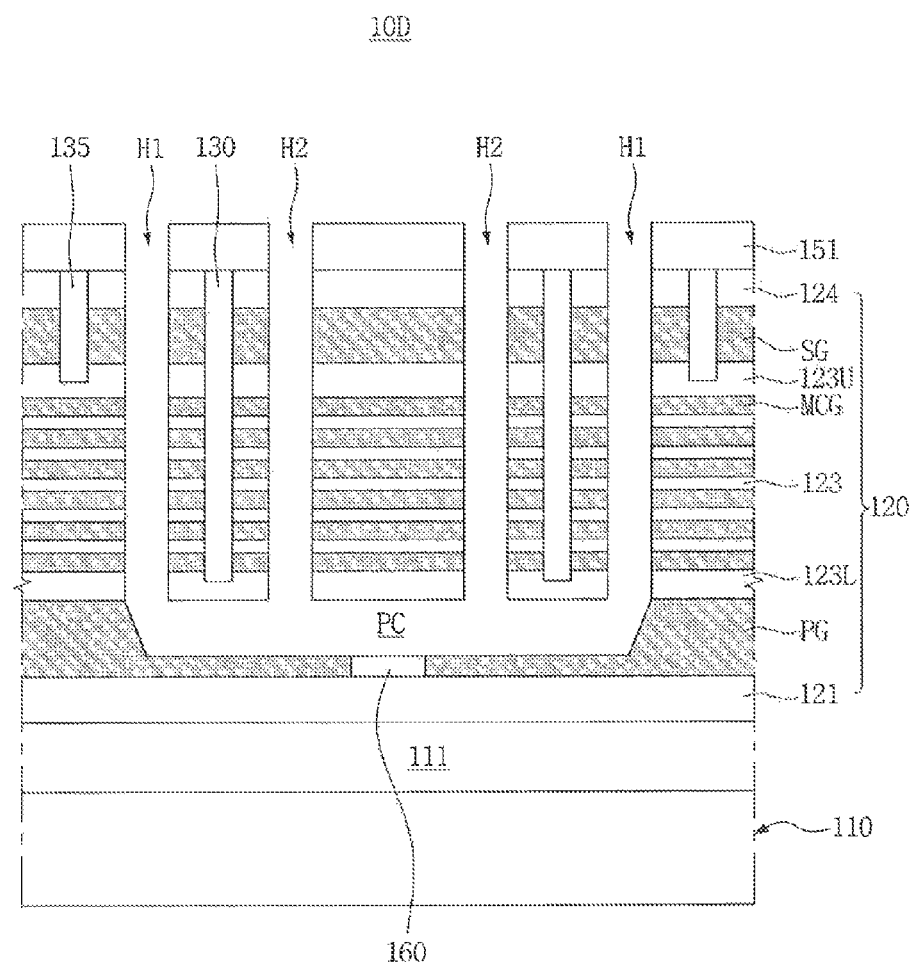
Figure 6L:
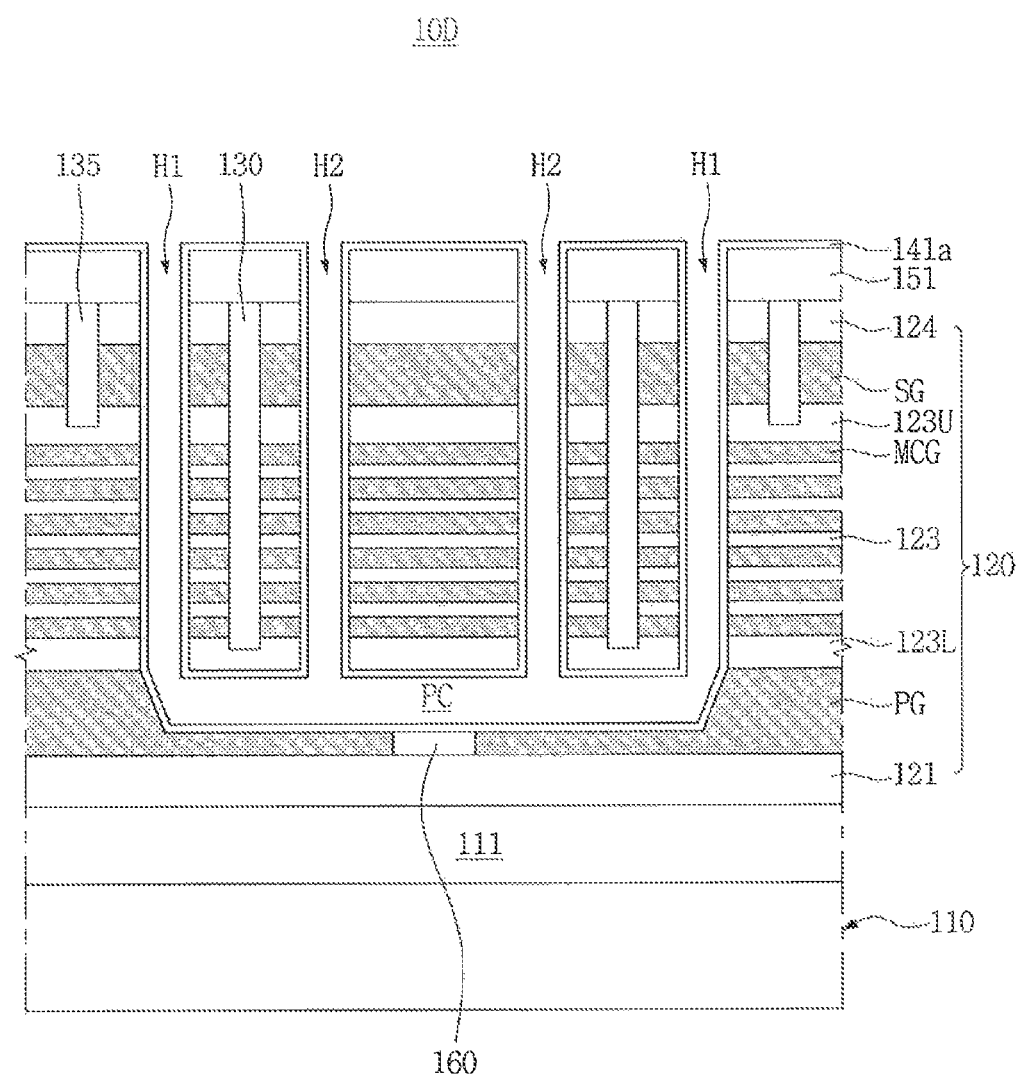
Figure 6M:
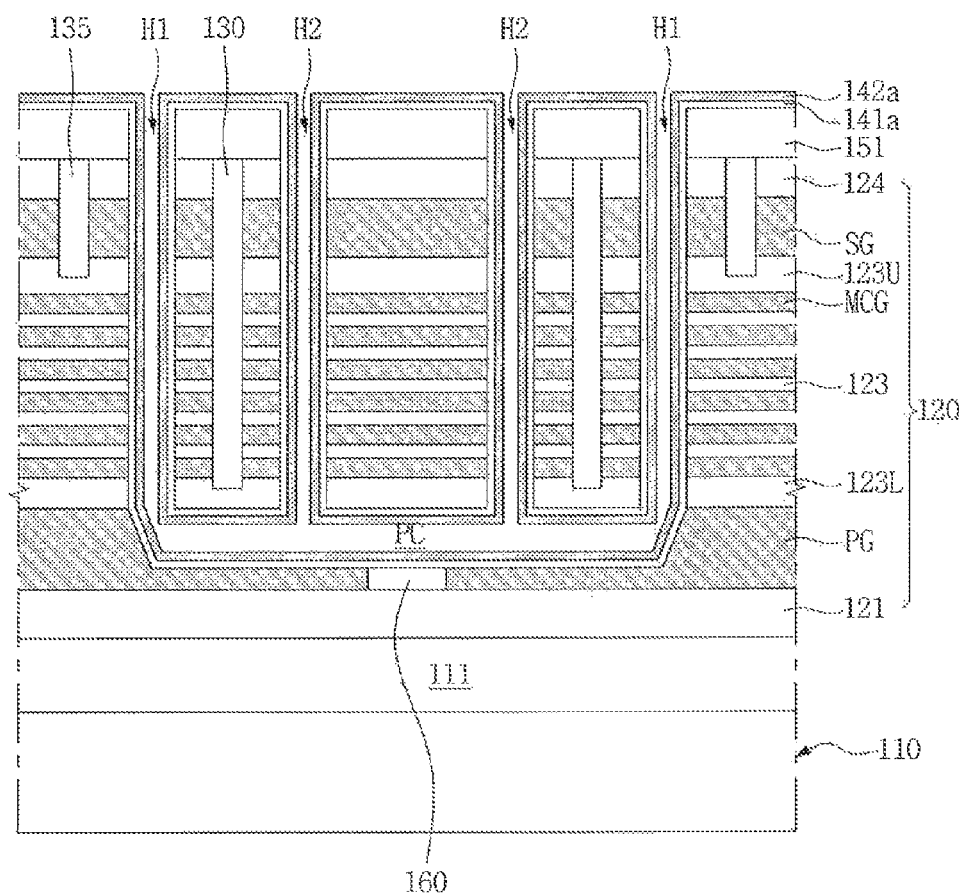
Figure 6N:
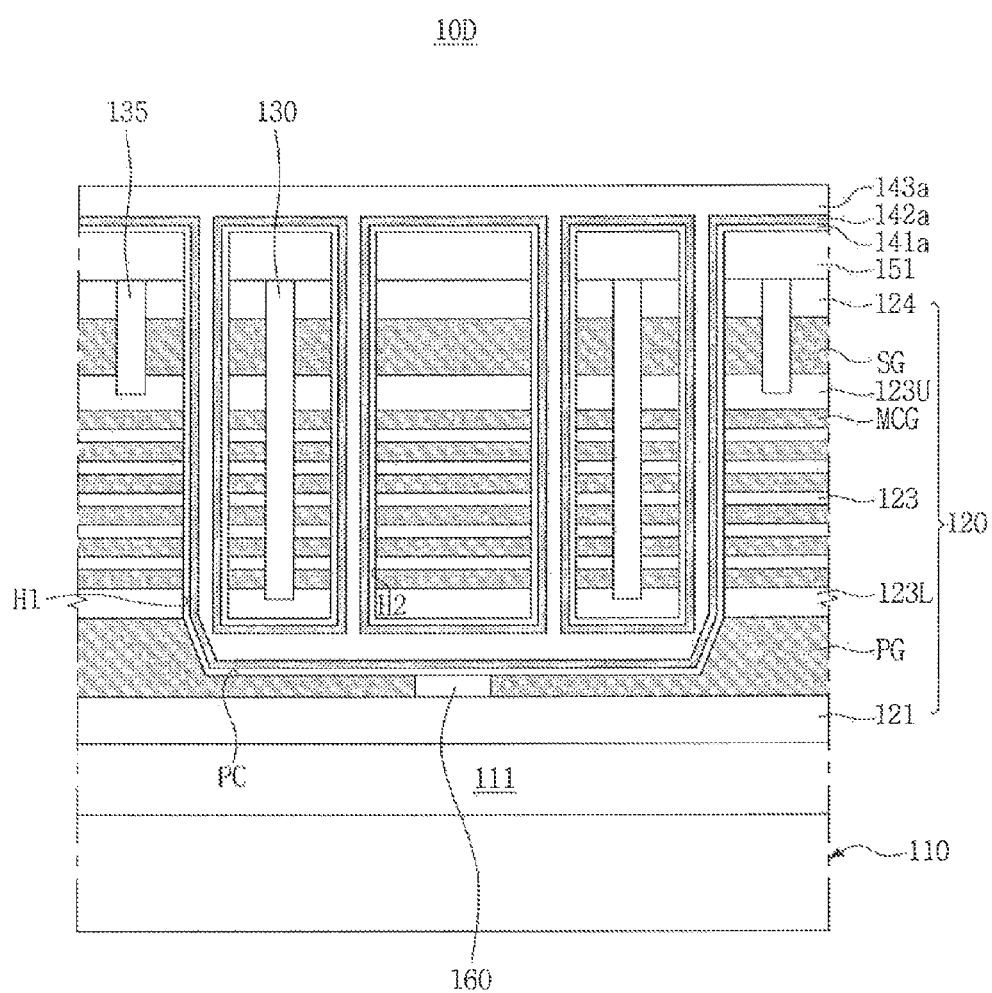
Figure 60:
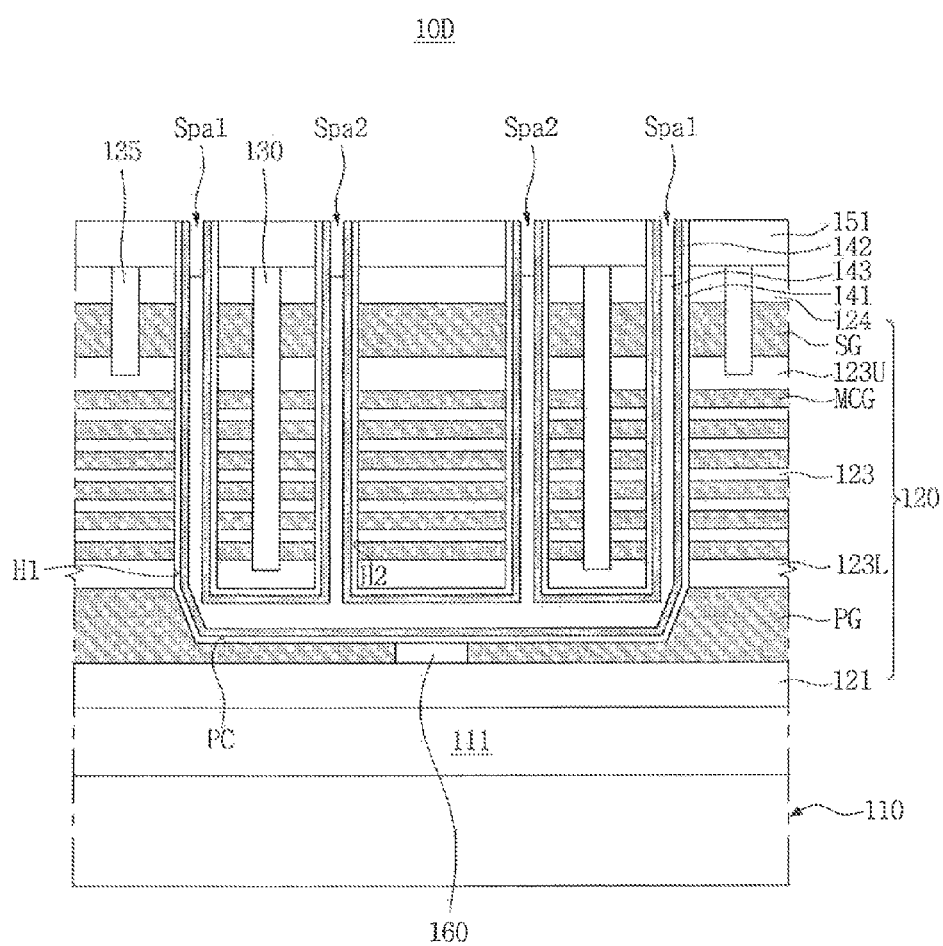
Figure 6P:
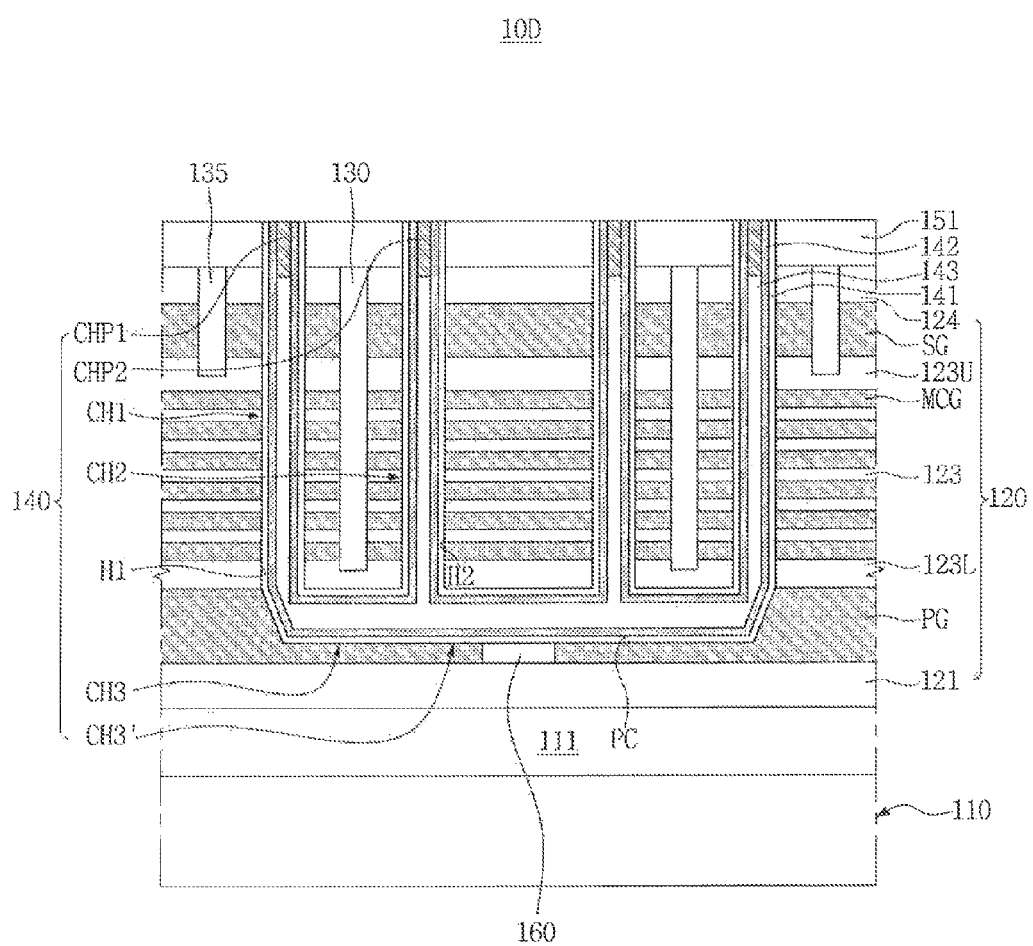
Figure 6Q:
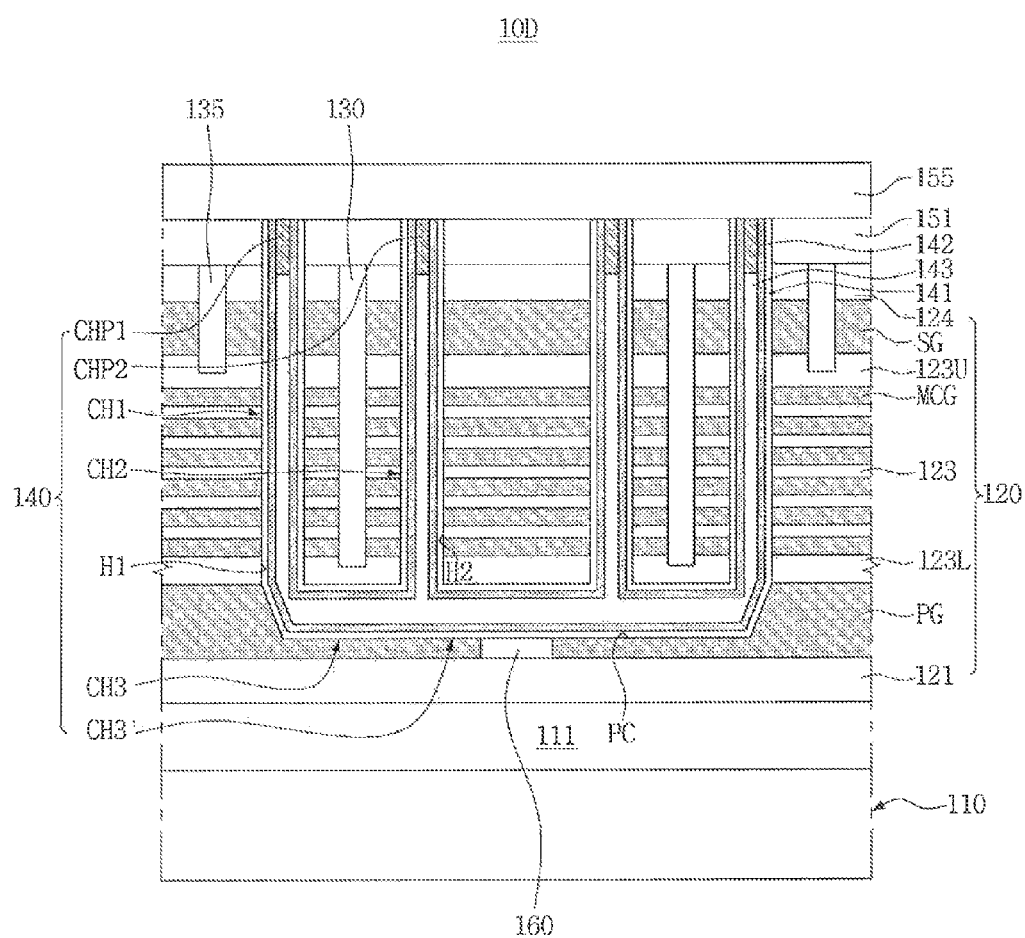
Figure 6R:
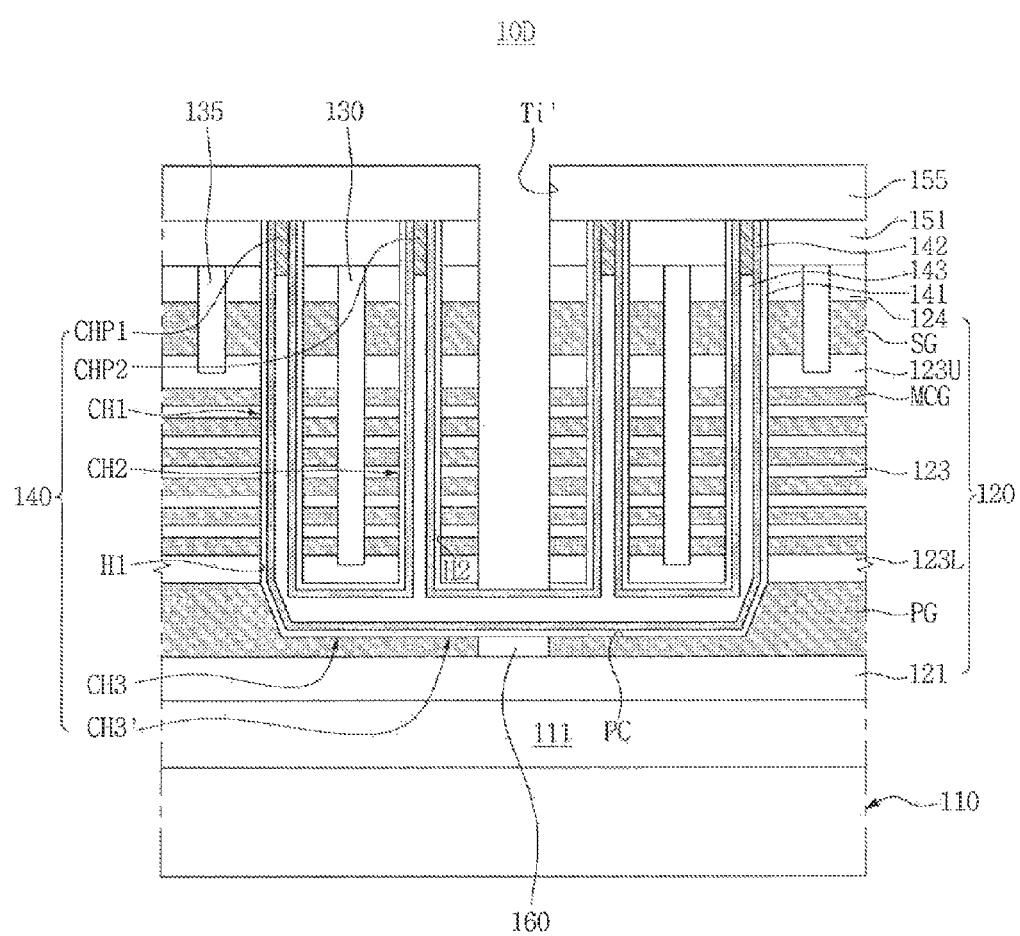
Figure 6S:
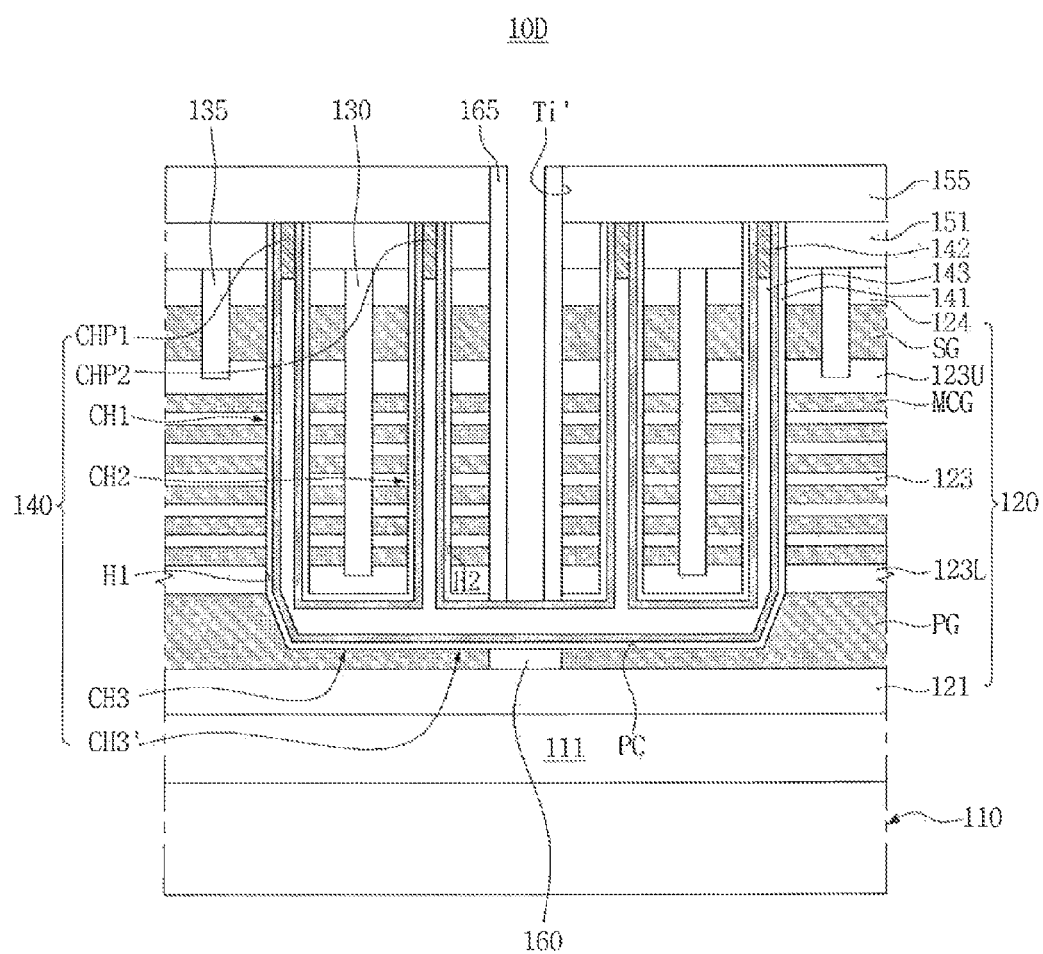
Figure 6T:
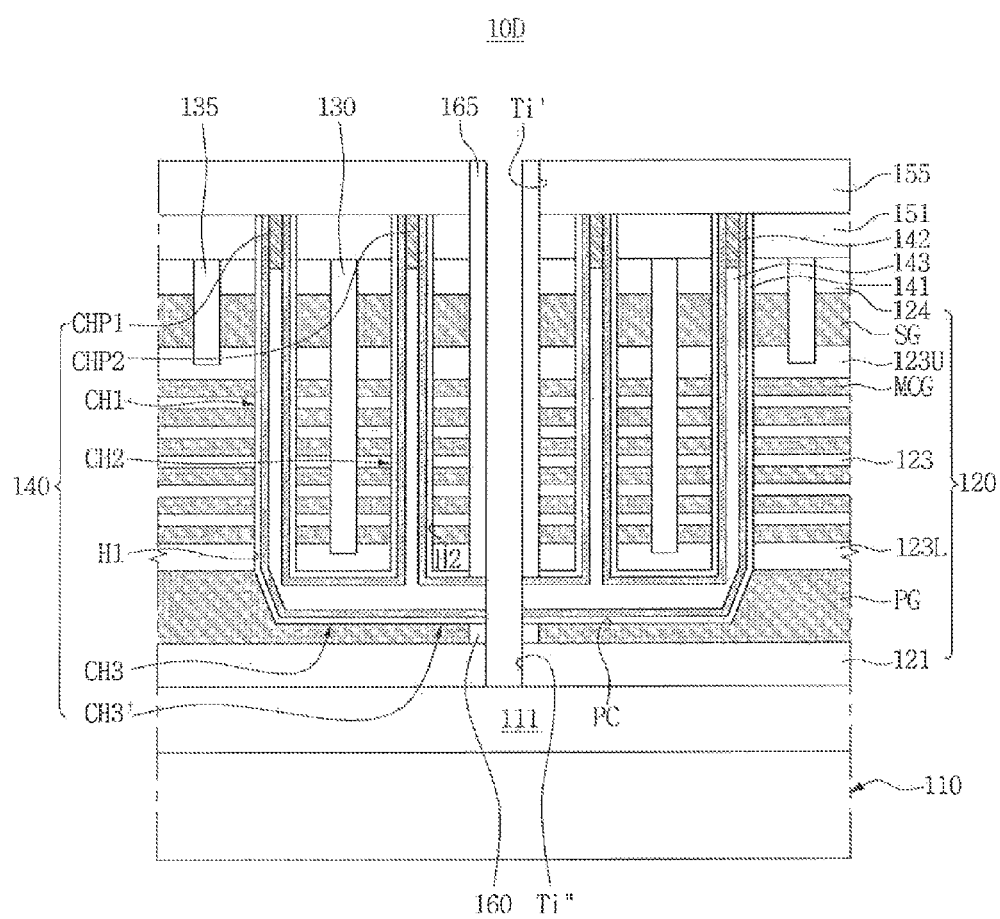
Figure 6U:
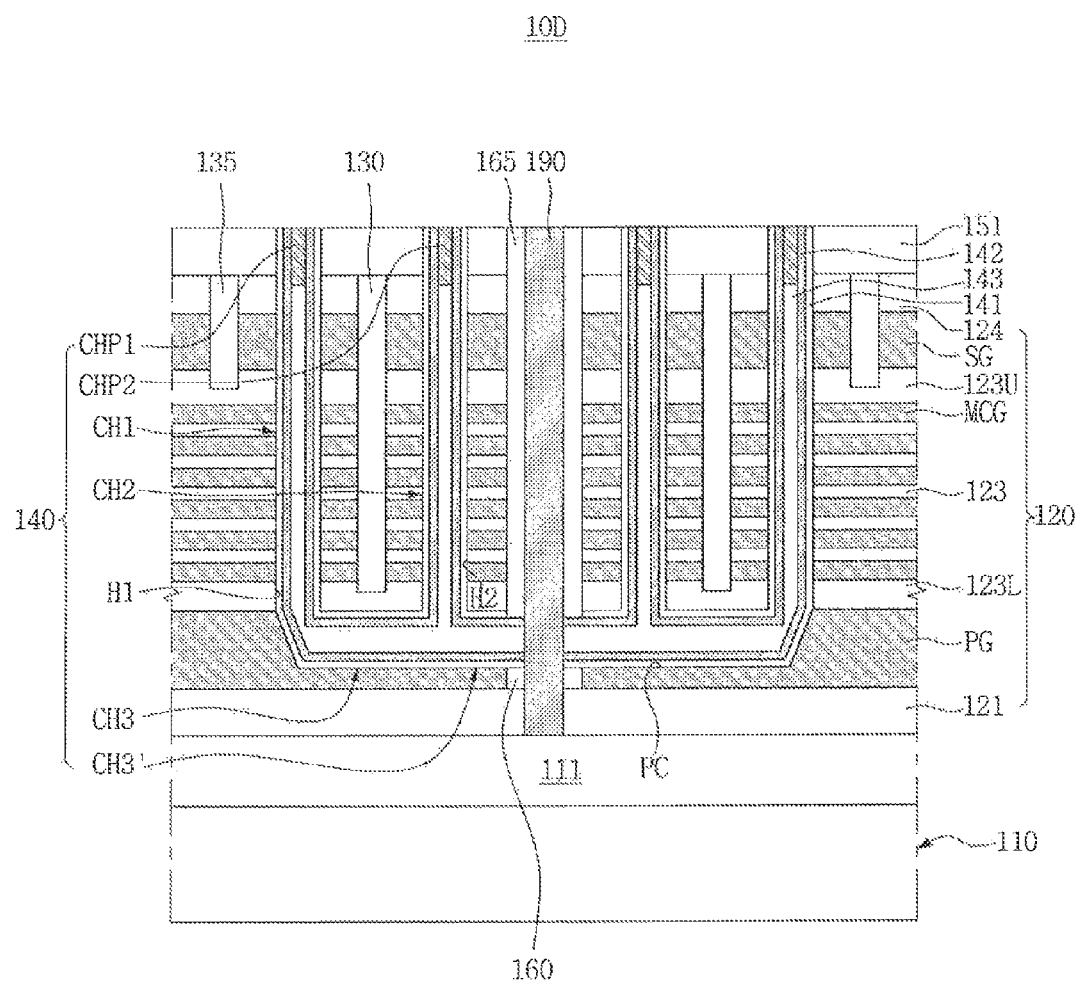
Figure 6V:
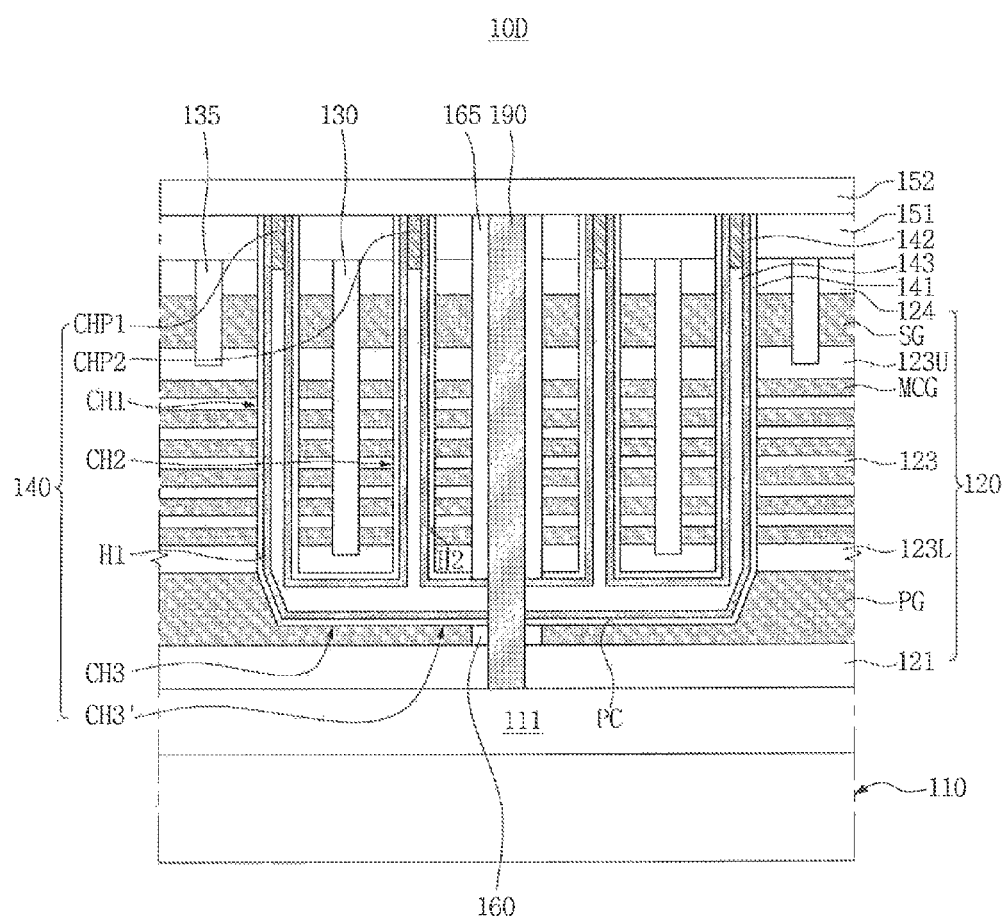
Figure 6W:
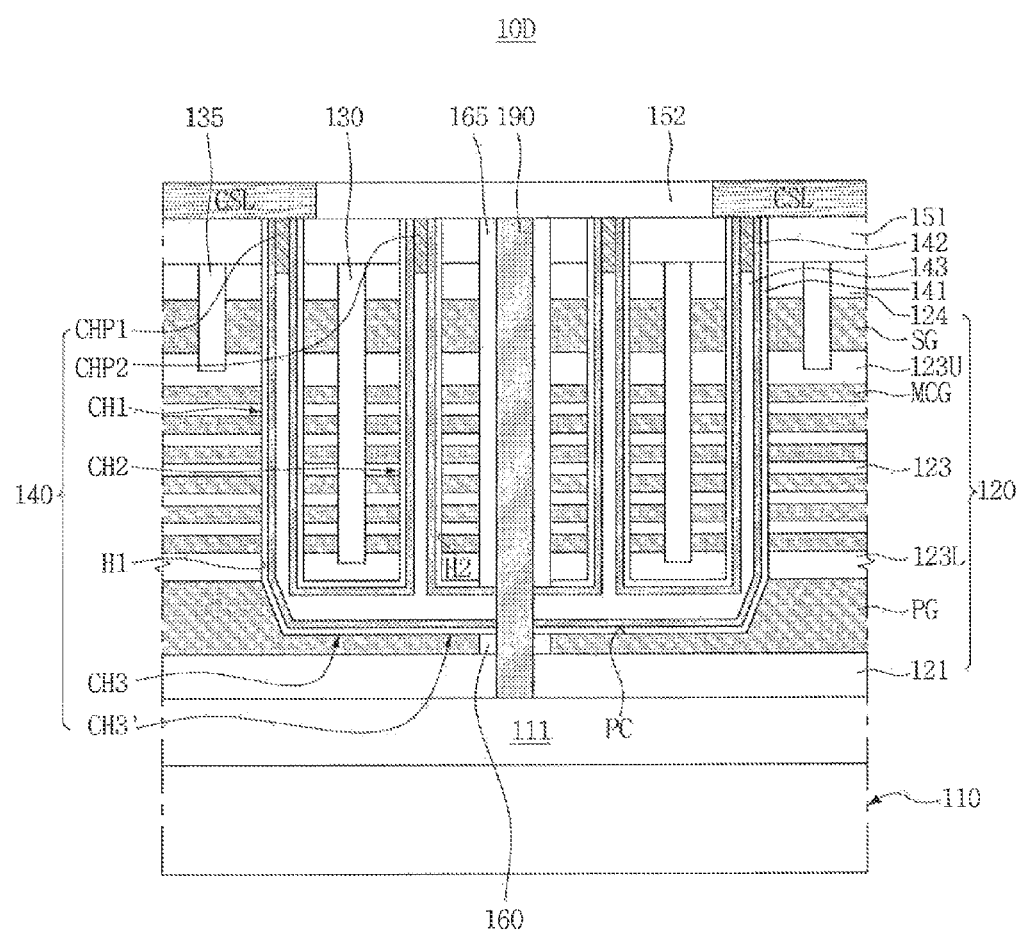
Figure 6X:
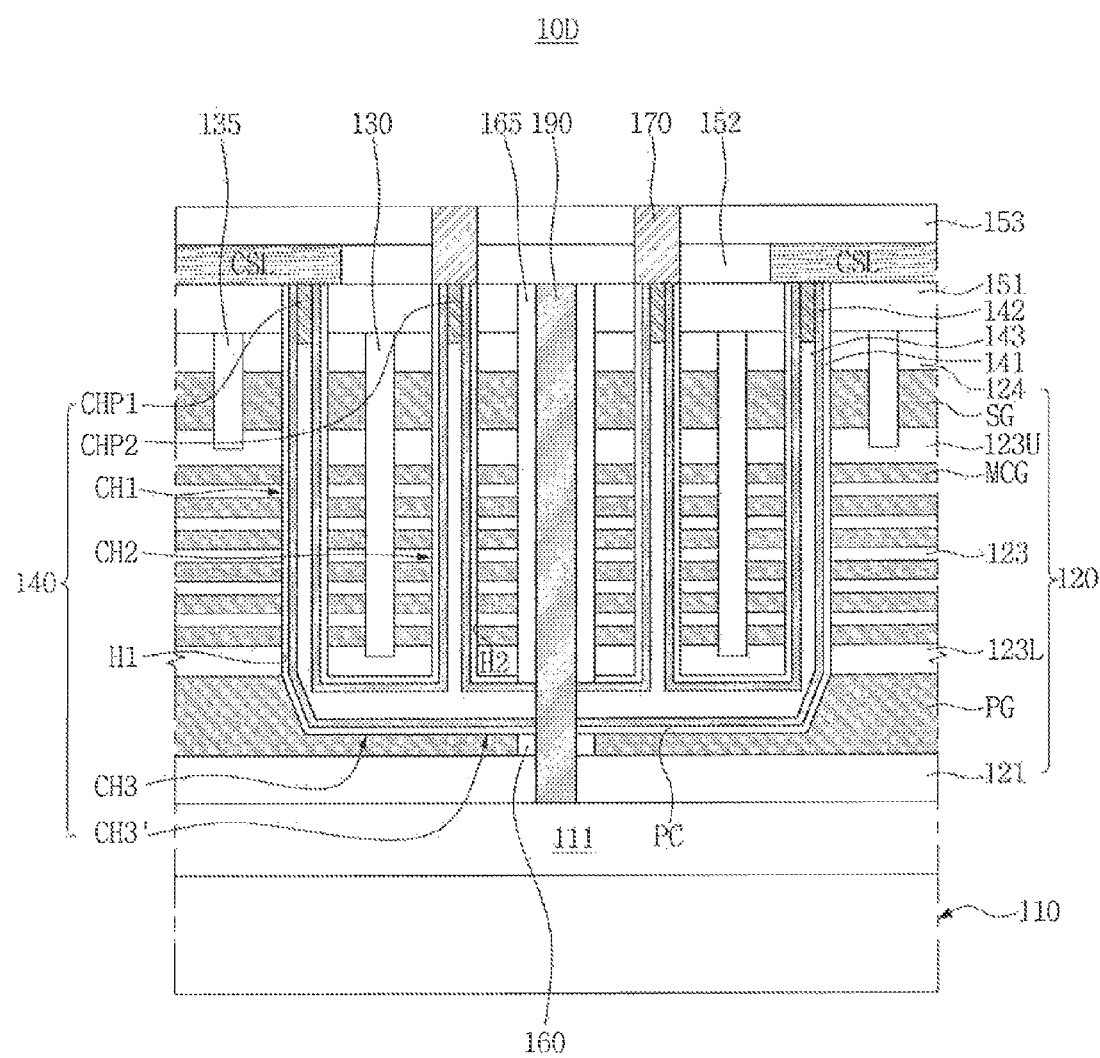

FIGS. 6A to 6X are vertical cross-sectional views taken along line I-I' shown in FIG. 4A for describing a method of manufacturing a non-volatile memory device in accordance with an exemplary embodiment of the inventive concept.

Referring to FIG. 6A, a method of manufacturing a non-volatile memory device 10D in accordance with an exemplary embodiment of the inventive concept may include forming a lowermost interlayer insulating layer 121 on a well 111, and forming a pipe gate electrode PG on the lowermost interlayer insulating layer 121. The lowermost interlayer insulating layer 121 may include silicon oxide. The pipe gate electrode PG may include polysilicon, a metal, a metal compound, or a metal alloy. The metal, for example, may include tungsten (W).

Referring to FIG. 6B, the method may include forming a first device isolation trench Ti vertically passing through the pipe gate electrode PG, and expose the lowermost interlayer insulating layer 121 by performing an etching process.

Referring to FIG. 6C, the method may include forming a device isolation pattern 160 filling the first device isolation trench Ti. The device isolation pattern 160 may include silicon oxide.

Referring to FIG. 6D, the method may include forming a pipe connection space PG in the pipe gate electrode PG by performing an etching process. A part of upper portion of the device isolation pattern 160 may be etched by the pipe connection space PG, and a part of lower portion thereof may remain under the pipe connection space PG. The pipe connection space PG may be formed to dispose channel structures 140, which will be described later, on left and right sides of the device isolation pattern 160.

Referring to FIG. 6E, the method may include filling the pipe connection space PG with a sacrificial layer 125. The sacrificial layer 125 may include silicon nitride (SiN) or silicon germanium (SiGe).

Referring to FIG. 6F, the method may include alternately and repeatedly forming a plurality of intermediate interlayer insulating layers 123L, 123, and 123U, and a plurality of memory-cell gate electrodes MCG on the pipe gate electrode PG and the sacrificial layer 125. The method may include forming a select gate electrode SG on an uppermost intermediate interlayer insulating layer 123U of the plurality of intermediate interlayer insulating layers 123L, 123, and 123U, and forming an upper interlayer insulating layer 124 on the select gate electrode SG.

The formation of the plurality of intermediate interlayer insulating layers 123L, 123, and 123U, and the upper interlayer insulating layer 124 may include forming silicon oxide layers by performing a deposition process. The uppermost intermediate interlayer insulating layer 123U and a lowermost intermediate interlayer insulating layer 123L of the plurality of intermediate interlayer insulating layers 123L, 123, and 123U, and the upper interlayer insulating layer 124 may be relatively thicker than the other intermediate interlayer insulating layers 123.

The formation of the plurality of memory-cell gate electrodes MCG and the select gate electrode SG may include forming polysilicon layers, metal layers, metal compound layers, or metal alloy layers by performing a deposition process. For example, the metal layers, for example, may include tungsten (W). The select gate electrode SG may be relatively thicker than the plurality of memory-cell gate electrodes MCG.

In this process, a layered structure 120 including the plurality of interlayer insulating layers 121, 123L, 123, 123U, and 124, and the gate electrodes CG, PG, MCG, and SC may be formed.

Referring to FIG. 6G, the method may include forming channel isolation patterns 130 vertically passing through the upper interlayer insulating layer 124, the select gate electrode SG, the plurality of memory-cell gate electrodes MCG, and the plurality of intermediate interlayer insulating layers 123, and 123U. Bottoms of the channel isolation patterns 130 may be located in the lowermost intermediate interlayer insulating layer 123L.

The channel isolation patterns 130 are intended for separating first and second vertical channels CH1 and CH2 of a channel structure 140 which will be described later. To this end, the channel isolation patterns 130 may be formed to dispose between the first and second vertical channels CH1 and CH2.

The formation of the channel isolation patterns 130 may include forming a channel isolation trenches Tc vertically passing through the upper interlayer insulating layer 124, the select gate electrode SG, the plurality of memory-cell gate electrodes MCG, and the plurality of intermediate interlayer insulating layers 123, and 123U by performing an etching process, and filling the channel isolation trenches Tc with an insulating material. Bottoms of the channel isolation trenches Tc may be located in the lowermost intermediate interlayer insulating layer 123L. The insulating material may include silicon oxide. The channel isolation patterns 130 may include the same material as the upper interlayer insulating layer 124 and the intermediate interlayer insulating layers 123L, 123, and 123U. Hereinafter, the drawing figure Tc will be omitted for the convenience of description.

Referring to FIG. 6H, the method may include forming select line isolation patterns 135 vertically passing through the select gate electrode SG. The select line isolation pattern 135 is intended for separating strings ST. The formation of the select line isolation pattern 135 is the same as described in FIG. 5F.

Referring to FIG. 6I, the method may include forming a first capping layer 151 covering the channel isolation patterns 130 and the select line isolation patterns 135 on the upper interlayer insulating layer 124 by performing a deposition process. The first capping layer 151 may include silicon oxide.

Referring to FIG. 6J, the method may include forming first and second channel holes H1 and H2 vertically passing through the layered structure 120 and expose an upper surface of the sacrificial layer 125 by performing an etching process.

Referring to FIG. 6K, the method may include forming a pipe connection space PG by removing the sacrificial layer 125 through the first and second channel holes H1 and H2.

The sacrificial layer 125 may be removed by an etchant provided through the first and second channel holes H1 and H2. When the sacrificial layer 125 includes silicon nitride, phosphoric acid may be used as the etchant. When the sacrificial layer 125 includes silicon germanium, ammonia may be used as the etchant.

Referring to FIG. 6L, the method may include conformally forming a gate insulating layer 141a on inside walls of the first and second channel holes H1 and H2, and the pipe connection space PG by performing a deposition process.

The gate insulating layer 141a is shown as a single layer in the drawing but need not be limited thereto, and be formed as a multilayer. For example, the gate insulating layer 141a may include a charge barrier layer, a charge trap layer, and a tunnel insulating layer, which are sequentially formed on the inside walls of the first and second channel holes H1 and H2, and the pipe connection spaces PG. The charge barrier layer, for example, may include silicon oxide. The charge trap layer, for example, may include silicon nitride or a high-k dielectric material. The high-k dielectric material may include aluminum oxide (MO), zirconium oxide (ZrO), hafnium oxide (HfO), or lanthanum oxide (LaO). The tunnel insulating layer, for example, may include silicon oxide.

Referring to FIG. 6M, the method may include conformally forming a channel active layer 142a on the gate insulating layer 141a by performing a deposition process. The channel active layer 142a may include polysilicon.

Referring to FIG. 6N, the method may include forming a channel core layer 143a filling the first and second channel holes H1 and H2, and the inside of the pipe connection space PG on the channel active layer 142a. The channel core layer 143a may include silicon oxide.

Referring to FIG. 6O, the method may include forming source-side and drain-side channel pad spaces Spa1 and Spa2 by recessing a part of an upper portion of the channel core layer 143a by performing a planarization process such as an etch-back process and a CMP process.

In this process, the gate insulating layer 141a, the channel active layer 142a and the channel core layer 143a may be changed to a gate insulating pattern 141, a channel active pattern 142 and a channel core pattern 143.

Referring to FIG. 6P, the method may include forming source-side and drain-side channel pads CHP1 and CHP2 filling the inside of the source-side and drain-side channel pad spaces Spa1 and Spa2.

The source-side and drain-side channel pads CHP1 and CHP2 may include polysilicon which is doped with a high concentration N-type impurity. Side surfaces of the source-side and drain-side channel pads CHP1 and CHP2 may be surrounded by the corresponding channel active pattern 142.

In this process, a channel structure 140 having the first and second vertical channels CH1 and CH2, the pipe channel CH3, and the source-side and drain-side channel pads CHP1 and CHP2 may be formed.

Referring to FIG. 6Q, the method may include forming a temporary capping layer 155 covering the channel structure 140 on the first capping layer 151 by performing a deposition process. The temporary capping layer 155 may include silicon oxide.

Referring to FIG. 6R, the method may include forming a second device isolation trench Ti' vertically passing through the layered structure 120, and expose the channel active pattern 142 of the pipe channel CH3 by performing an etching process. Here, the exposed channel active pattern 142 may serve as an etch stop layer.

The second device isolation trench Ti' may be disposed to be spaced apart at a predetermined distance in a horizontal direction in units of a pair of the channel structures 140 in a top view. The second device isolation trench Ti' may be vertically aligned with the isolation pattern 160.

Referring to FIG. 6S, the method may include forming spacers 165 on inside walls of the second device isolation trench Ti'. The spacers 165 may include silicon oxide or silicon nitride.

Referring to FIG. 6T, the method may include forming a third device isolation trench Ti" exposing the well 111 by performing an etching process. The third device isolation trench Ti" may be vertically aligned with side surfaces of the spacers 165 formed on the inside walls of the second device isolation trench Ti'.

Referring to FIG. 6U, the method may include forming a substrate extending part 190 filling the second and third device isolation trenches Ti' and Ti". Further, the method may include removing the temporary capping layer 155, and exposing the first capping layer 151 by performing a planarization process such as a CMP process.

The substrate extending part 190 may include a polysilicon or metal such as tungsten (W). The substrate extending part 190 may have a line shape in parallel with the channel isolation patterns 130 and the select line isolation pattern 135 in a top view.

Referring to FIG. 6V, the method may include forming a second capping layer 152 covering the substrate extending part 190 and the channel structure 140 on the first capping layer 151 by performing a deposition process. The second capping layer 152 may include silicon oxide.

Referring to FIG. 6W, the method may include forming a common source line CSL passing through the second capping layer 152, and contacting the source-side channel pad CHP1 of the first vertical channel CH1. The common source line CSL may be formed to commonly connect also to a source-side channel pad CHP1 of a first vertical channel CH1 of an adjacent channel structure 140. The common source line CSL may include a metal or a metal compound. The common source lines CSL may have line shapes in parallel in a top view. Further, the common source lines CSL may be in parallel with the channel isolation patterns 130, the select line isolation pattern 135, and the device isolation patterns 160 in a top view.

Referring to FIG. 6X, the method may include forming a third capping layer 153 on the second capping layer 152 and the common source line CSL by performing a deposition process. The third capping layer 153 may include silicon oxide.

Further, the method may include forming bit plugs 170 vertically passing through the second and third capping patterns 152 and 153, and contact the drain-side channel pad patterns CHP2 of the second vertical channels CH2 of the channel structures 140.

The bit plugs 170 may include a metal compound or a metal silicide. Side surfaces of the bit plugs 170 may be surrounded by the second and third capping patterns 152 and 153.

Then, further referring to FIGS. 4A and 4B, the method may include forming bit lines BL electrically connected to the bit plugs 170 on the third capping layer 153. The bit lines BL may include a metal or a metal compound. The bit lines BL may have line shapes in parallel in a top view. Further, the bit lines BL may be perpendicular to the common source line CSL, the channel isolation patterns 130, the select line isolation pattern 135, and the substrate extending part 190 in a top view.

Figure 7A:
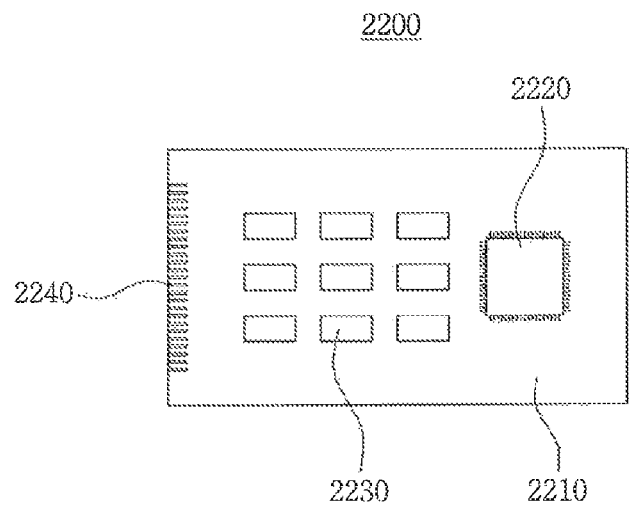
FIG. 7A is a conceptual view showing a semiconductor module including a non-volatile memory device according to an exemplary embodiment of the inventive concept.

FIG. 7A is a conceptual view showing a semiconductor module 2200 including the non-volatile memory devices 10A, 10B, 10C, or 10D in accordance with an exemplary embodiment of the inventive concept. Referring to FIG. 7A, the semiconductor module 2200 may include a processor 2220 and memory devices 2230 mounted on a semiconductor module substrate 2210. The processor 2220 or the memory devices 2230 may include the non-volatile memory devices 10A, 10B, 10C, and/or 10D in accordance with exemplary embodiments of the inventive concept. Input/output terminals 2240 may be disposed on at least one side of the module substrate 2210.

Figure 7B:
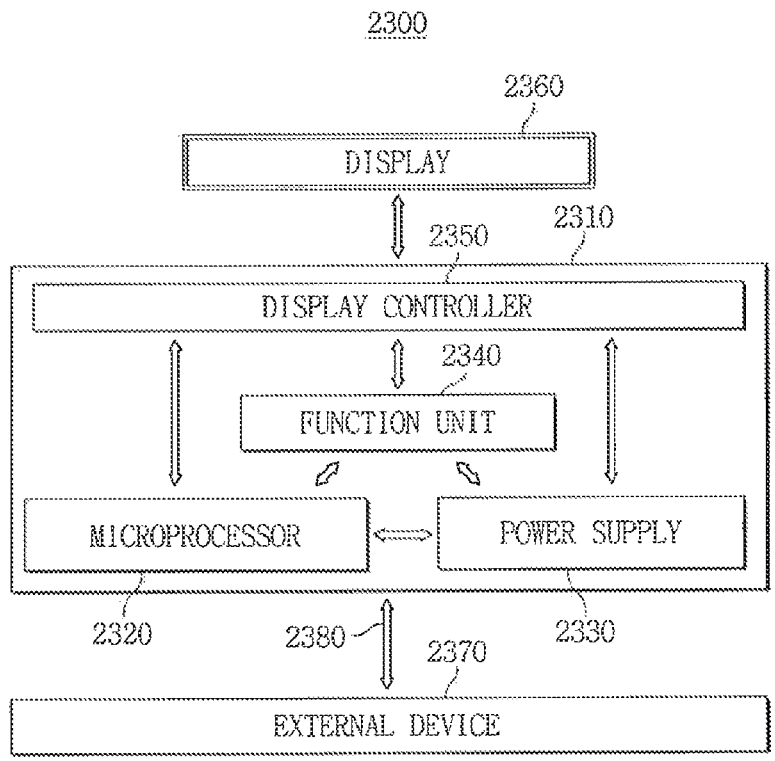
FIGS. 7B and 7C are conceptual block diagrams showing electronic systems according to an exemplary embodiment of the inventive concept.
Figure 7C:
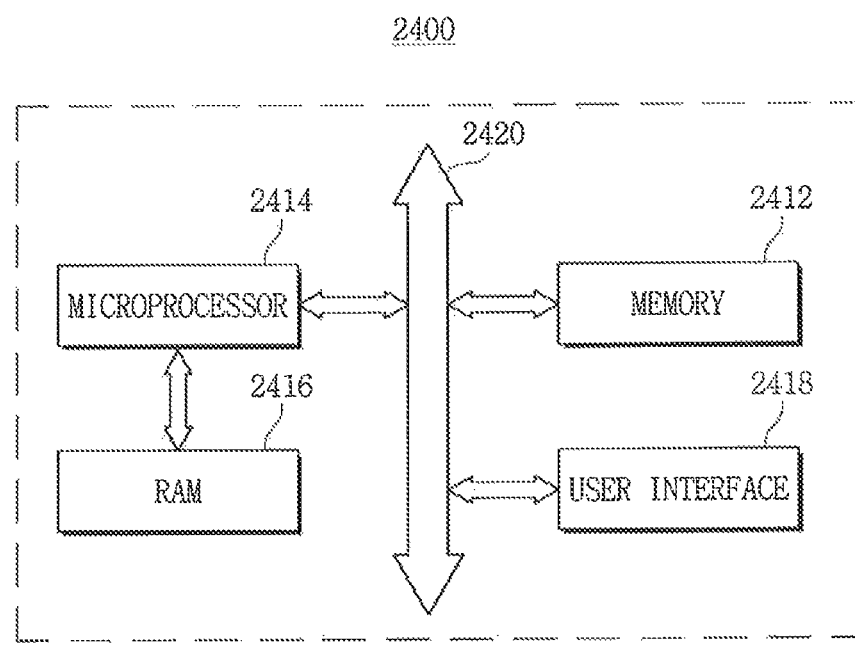

FIGS. 7B and 7C are conceptual block diagrams showing electronic systems in accordance with exemplary embodiments of the inventive concept. Referring to FIG. 7B, an electronic system 2300 may include a body 2310, a display 2360, and an external device 2370. The body 2310 may include a microprocessor 2320, a power supply 2330, a function unit 2340, and/or a display controller 2350. The body 2310 may include a system board or a motherboard having a PCB or the like, and/or a case. The microprocessor 2320, the power supply 2330, the function unit 2340, and the display controller 2350 may be mounted or disposed on an upper surface of the body 2310 or inside the body 2310. The display 2360 may be disposed on the upper surface of the body 2310 or inside/outside the body 2310. The display 2360 may display an image processed by the display controller 2350. For example, the display 2360 may include a liquid crystal display (LCD), active matrix organic light emitting diodes (AMOLED), or various display panels. The display 2360 may include a touch screen. Therefore, the display 2360 may have an input/output function. The power supply 2330 may supply current and a voltage to the microprocessor 2320, the function unit 2340, the display controller 2350, etc. The power supply 2330 may include a charging battery, a socket for a dry cell, or a voltage/current converter. The microprocessor 2320 may receive a voltage from the power supply 2330 to control the function unit 2340 and the display 2360. For example, the microprocessor 2320 may include a CPU or an application processor (AP). The function unit 2340 may perform various functions. For example, the function unit 2340 may include a touch pad, a touch screen, a volatile/non-volatile memory, a memory card controller, a camera, a light, an audio and video play processor, a wireless radio antenna, a speaker, a microphone, a USB port, or a unit having other various functions. The microprocessor 2320 and the function unit 2340 may include the non-volatile memory devices 10A, 10B, 10C, and/or 10D in accordance with exemplary embodiments of the inventive concept.

Referring to FIG. 7C, an electronic system 2400 in accordance with an exemplary embodiments of the inventive concept may include a microprocessor 2414, a memory 2412, and a user interface 2418. The user interface 2418 may perform data communication using a bus 2420. The microprocessor 2414 may include a CPU or an AP. The electronic system 2400 may further include a RAM 2416 for the operation of the microprocessor 2414. The microprocessor 2414 and/or the RAM 2416 may be assembled within a single package. The user interface 2418 may be used to input data to the electronic system 2400, or output data from the electronic system 2400. For example, user interface 2418 may include a touch pad, a touch screen, a keyboard, a mouse, a speech detector, a cathode ray tube (CRT) monitor, an LCD, an AMOLED, a plasma display pad (PDP), a printer, a light, or various input/output devices. The memory 2412 may store operational codes of the microprocessor 2414, data processed by the microprocessor 2414, or data received from the outside. The memory 2412 may include a memory controller, a hard disk, or a solid state drive (SSD). The microprocessor 2414, the RAM 2416, and/or the memory 2412 may include the non-volatile memory devices 10A, 10B, 10C, and/or 10D in accordance with exemplary embodiments of the inventive concept.

According to an exemplary embodiments of the inventive concept, a channel structure, including first and second vertical channels which is in contact with a well, and a pipe channel which connects the first and second vertical channels, are provided. A cut-off gate electrode, disposed between the pipe channel and the well, and through which the first and second vertical channels pass, is provided. Since the first and second vertical channels and the well are electrically disconnected by applying an off-voltage to the cut-off gate electrode when program and read operations are performed, leakage current which can flow to a substrate can be prevented, and self-boosting voltages of unselected memory cells may be maintained.

Since the first and second vertical channels and the well are electrically connected by applying an on-voltage to the cut-off gate electrode when an erase operation is performed, selected memory cells can be erased at once in units of blocks by directly applying an erase voltage to the well. Thus, the erase operation can be easier, and erasing time can also be reduced.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A non-volatile memory device, comprising:
a substrate having a well;
a first vertical channel structure and a second vertical channel structure, wherein the first and second vertical channel structures are in contact with the well and protrude from the well;
a horizontal channel structure connecting the first and second vertical channel structures;
a first gate electrode formed over the substrate and under the horizontal channel structure and surrounding side surfaces of the first and second vertical channel structures;
a second gate electrode stacked over the first gate electrode and surrounding the horizontal channel structure;
a plurality of third gate electrodes stacked over the second gate electrode and surrounding the side surfaces of the first and second vertical channel structures; and
a plurality of interlayer insulating layers formed between the first, second and third gate electrodes,
wherein the first and second vertical channel structures vertically pass through the first, second and third gate electrodes to be directly in contact with the well, and
wherein the first vertical channel structure is connected to a first end surface of the horizontal channel structure, and the second vertical channel structure is connected to a second end surface of the horizontal channel structure opposite to the first end surface of the horizontal channel structure.

2. The device according to claim 1,
wherein the first and second vertical channel structures comprise:
a first gate insulating pattern conformally formed on inside walls of a first channel hole and a second channel hole each vertically passing through the plurality of third gate electrodes, the second gate electrode, the first gate electrode, and the plurality of interlayer insulating layers, and exposing the well;
a first channel active pattern conformally formed on the first gate insulating pattern and the exposed well; and
a first channel core pattern filling the first and second channel holes disposed on the first channel active pattern.

3. The device according to claim 2,
wherein the horizontal channel structure comprises:
a second gate insulating pattern conformally formed on an inside wall of a horizontal connection space in the second gate electrode, wherein the second gate insulating pattern is horizontally connected to sides of the first and second channel holes;
a second channel active pattern conformally formed on the second gate insulating pattern; and a second channel core pattern filling inside of the horizontal connection space on the second channel active pattern, wherein the second gate insulating pattern is contiguous to the first gate insulating pattern, the second channel active pattern is contiguous to the first channel active pattern, and the second channel core pattern is contiguous to the first channel core pattern.

4. The device according to claim 1, wherein the first gate electrode is a cut-off gate electrode, the second gate electrode is a pipe gate electrode, and the plurality of third gate electrodes is a plurality of memory-cell gate electrodes.

5. The device according to claim 1, further comprising: a channel isolation pattern having an insulating material vertically passing through the plurality of third gate electrodes located between the first and second vertical channel structures.

6. The device according to claim 5, wherein the plurality of third gate electrodes comprise:
a first group of the third gate electrodes separated by the channel isolation pattern and surrounding the side surface of the first vertical channel structure; and
a second group of the third gate electrodes separated by the channel isolation pattern and surrounding the side surface of the second vertical channel structure.

7. The device according to claim 1, wherein if program and read operations are performed, an off-voltage is applied to the first gate electrode.

8. The device according to claim 1, wherein if an erase operation is performed, an on-voltage is applied to the first gate electrode.

9. The device according to claim 1, wherein lower ends of the first and second vertical channel structures protrude into the well so that the lower ends of the first and second vertical channel structures penetrate the first gate electrode to be directly in contact with the well.

10. The device according to claim 1, further comprising: a selective epitaxial growth layer formed between bottoms of the first and second vertical channel structures, and the well.

11. A non-volatile memory device, comprising:
a substrate having a well;
a layered structure including a plurality of interlayer insulating layers separately stacked over the well, and a first gate electrode, a second gate electrode, and a plurality of third gate electrodes, which are formed between the plurality of interlayer insulating layers over the well;
a channel structure including a first vertical channel structure and a second vertical channel structure each vertically passing through the layered structure and contacting the well, and a horizontal channel structure connecting the first and second vertical channel structures; and a channel isolation pattern vertically disconnecting the plurality of third gate electrodes located between the first and second vertical channel structures,
wherein the first and second vertical channel structures are formed in a first channel hole and a second channel hole each vertically passing through the layered structure and exposing the well, and
wherein the horizontal channel structure is formed in a horizontal connection space horizontally connected to side surfaces of the first and second channel holes in the second gate electrode, and
wherein lower ends of the first and second vertical channel structures are lower than a lower end of the channel isolation pattern and are directly in contact with the well.

12. The device according to claim 11, wherein the channel structure further comprises: a gate insulating pattern conformally formed on inside walls of the first and second channel holes and the horizontal connection space; a channel active pattern con formally formed on the gate insulating pattern and the exposed well; and a channel core pattern formed to fill the first and second channel holes and the horizontal connection space on the channel active pattern.

13. The device according to claim 12, wherein the channel structure further comprises:
a source-side channel pad formed in a space in which an upper portion of the channel core pattern of the first vertical channel structure is partially recessed; and
a drain-side channel pad formed in a space in which an upper portion of the channel core pattern of the second vertical channel structure is partially recessed.

14. The device according to claim 13, wherein side surfaces of the source-side channel pad and the drain-side channel pad each are surrounded by the channel active pattern.

15. The device according to claim 13, further comprising:
a common source line electrically connected to the source-side channel pad of the first vertical channel structure of the channel structure;
a bit plug electrically connected to the drain-side channel pad of the second vertical channel structure of the channel structure;
a bit line electrically connected to the bit plug;
a first capping layer formed on the plurality of interlayer insulating layers and surrounding side surfaces of the first and second vertical channel structures;
a second capping layer formed on the first capping layer and surrounding a side surface of the common source line and a side surface of a lower portion of the bit plug; and
a third capping layer formed on the second capping layer, and covering the common source line and surround a side surface of an upper portion of the bit plug.

* * * * *